US012363911B2

(12) United States Patent
Jiang et al.

(10) Patent No.: US 12,363,911 B2
(45) Date of Patent: Jul. 15, 2025

(54) SEMICONDUCTOR STRUCTURE AND METHOD FOR FORMING THEREOF

(71) Applicant: Taiwan Semiconductor Manufacturing Company, Ltd., Hsinchu (TW)

(72) Inventors: Yu-Wei Jiang, Hsinchu (TW); Sheng-Chih Lai, Hsinchu County (TW); Feng-Cheng Yang, Zhudong Township (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 91 days.

(21) Appl. No.: 18/353,972

(22) Filed: Jul. 18, 2023

(65) Prior Publication Data
US 2023/0363175 A1 Nov. 9, 2023

Related U.S. Application Data

(62) Division of application No. 17/345,499, filed on Jun. 11, 2021, now Pat. No. 11,785,779.
(Continued)

(51) Int. Cl.
*H10B 51/30* (2023.01)
*H10B 51/10* (2023.01)
*H10B 51/20* (2023.01)

(52) U.S. Cl.
CPC ............. *H10B 51/30* (2023.02); *H10B 51/10* (2023.02); *H10B 51/20* (2023.02)

(58) Field of Classification Search
CPC ......... H10B 51/10; H10B 51/20; H10B 51/30
See application file for complete search history.

(56) References Cited

U.S. PATENT DOCUMENTS

2008/0149733 A1 6/2008 Yukawa et al.
2017/0323899 A1* 11/2017 Park .................. H10B 43/27
(Continued)

FOREIGN PATENT DOCUMENTS

SG 10202003637 Y 3/2021
WO 2018144957 A1 8/2018

OTHER PUBLICATIONS

Non-Final Office Action dated Feb. 3, 2023 for U.S. Appl. No. 17/345,499.
(Continued)

*Primary Examiner* — Matthew E Warren
(74) *Attorney, Agent, or Firm* — Eschweiler & Potashnik, LLC

(57) ABSTRACT

The present disclosure provides a semiconductor structure. The semiconductor structure includes a substrate and a stacked structure disposed on the substrate. The stacked structure includes multiple alternately stacked insulating layers and gate members. A core structure is disposed in the stacked structure. The core structure includes a memory layer, a channel member, a contact member, and a liner member. The channel member is disposed on the memory layer. The contact member is disposed on the channel member. The liner member surrounds a portion of the core structure. The present disclosure also provides a method for fabricating the semiconductor structure.

20 Claims, 41 Drawing Sheets

Related U.S. Application Data

(60) Provisional application No. 63/167,788, filed on Mar. 30, 2021.

(56) References Cited

U.S. PATENT DOCUMENTS

| | | | |
|---|---|---|---|
| 2018/0151588 A1* | 5/2018 | Tsutsumi | H01L 21/0228 |
| 2018/0358380 A1 | 12/2018 | Yoo | |
| 2019/0115071 A1 | 4/2019 | Nardi et al. | |
| 2020/0227439 A1 | 7/2020 | Sato | |
| 2020/0350203 A1 | 11/2020 | Fratin et al. | |
| 2020/0388629 A1* | 12/2020 | Lee | H10B 43/10 |
| 2021/0375933 A1* | 12/2021 | Lu | H01L 21/02565 |
| 2022/0077183 A1 | 3/2022 | Morita et al. | |
| 2022/0285387 A1* | 9/2022 | Hinoue | H10B 43/27 |
| 2022/0285396 A1* | 9/2022 | Huang | H01L 29/516 |

OTHER PUBLICATIONS

Notice of Allowance dated May 31, 2023 for U.S. Appl. No. 17/345,499.

* cited by examiner

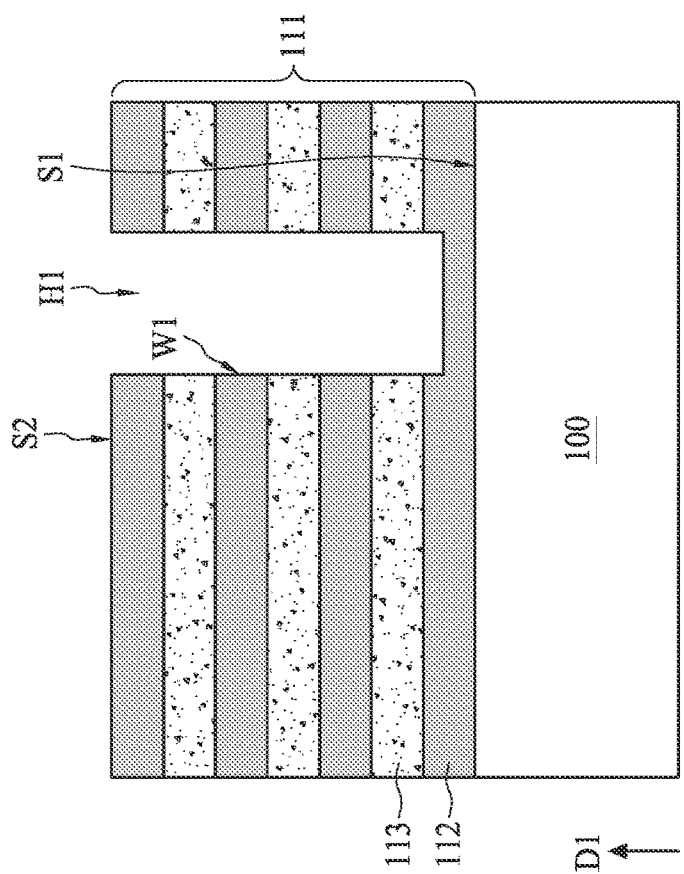
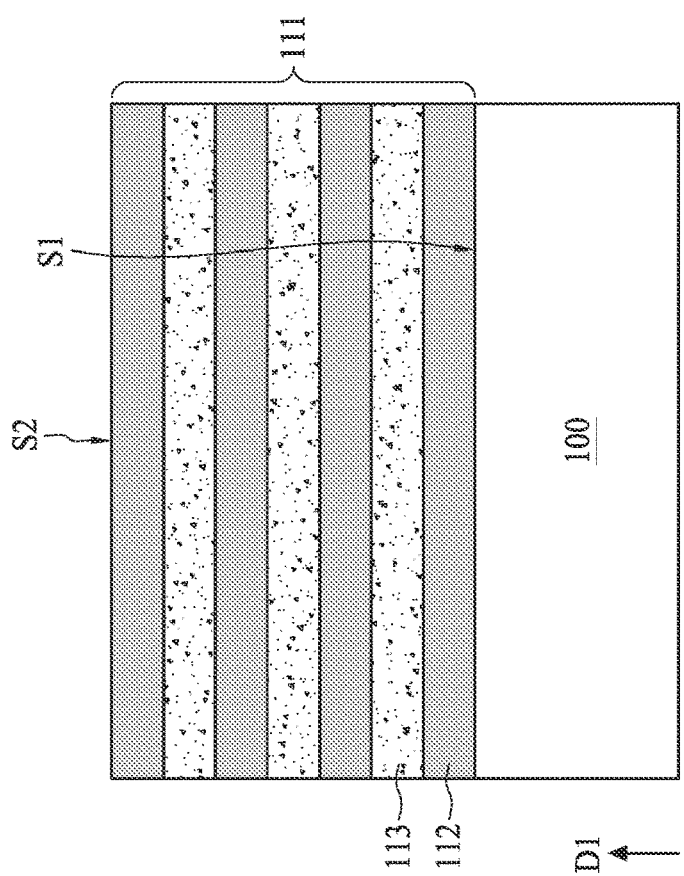

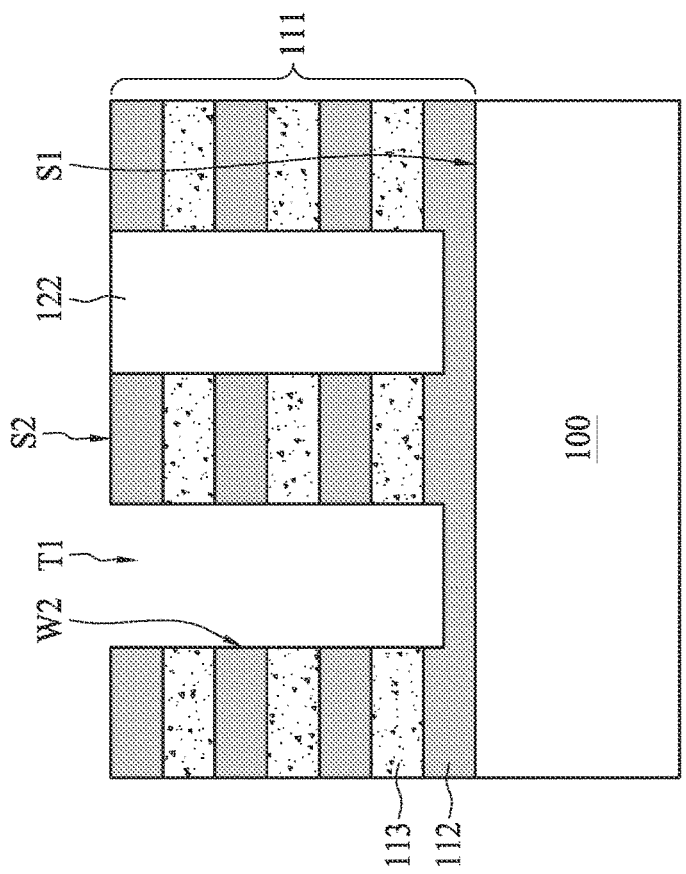
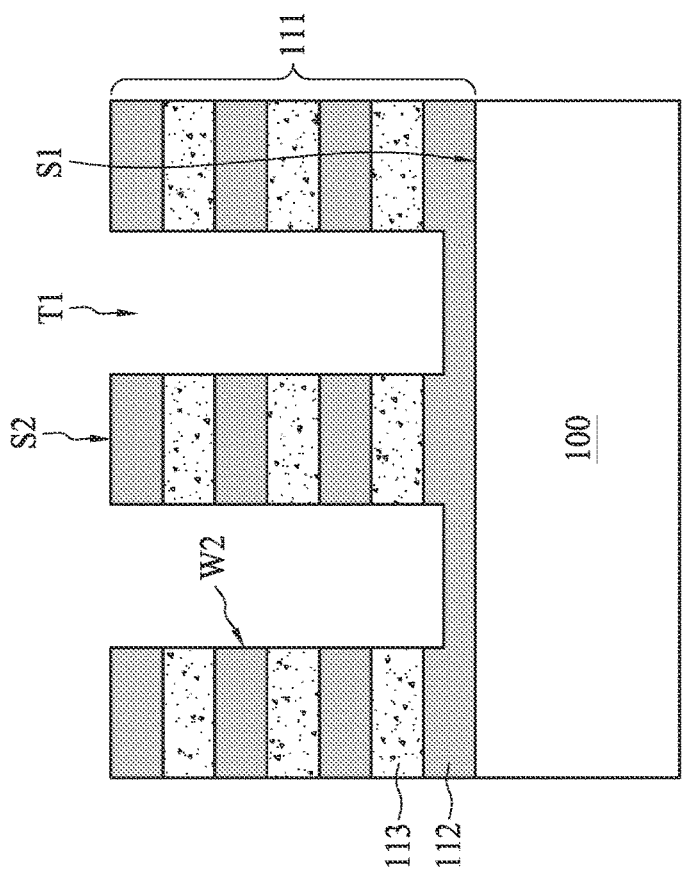
FIG. 11A
FIG. 11B

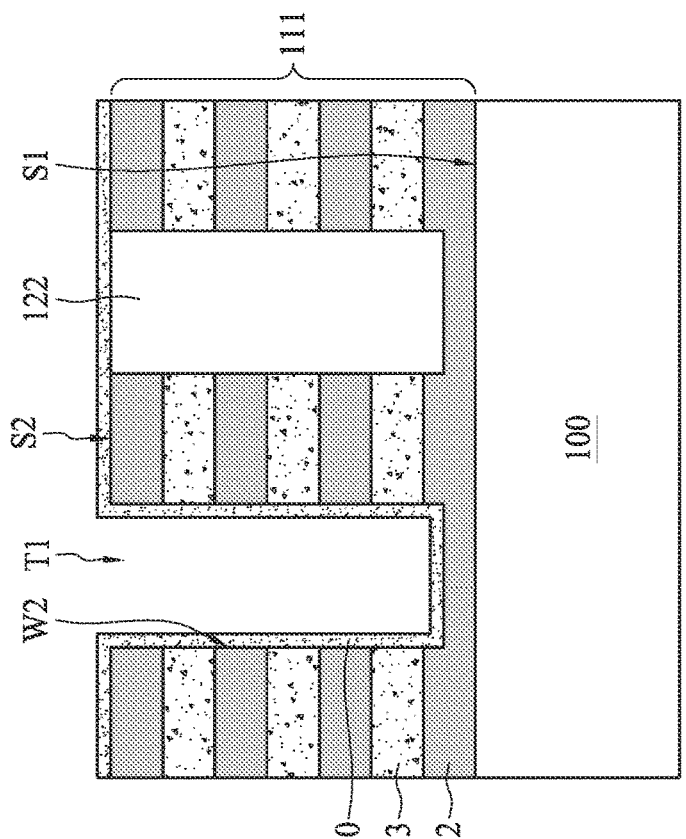
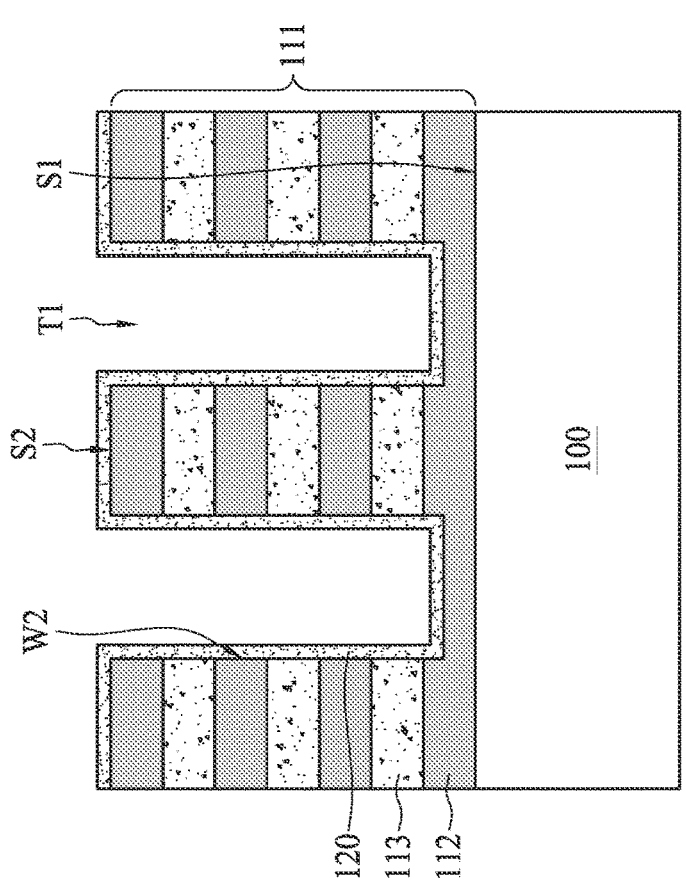

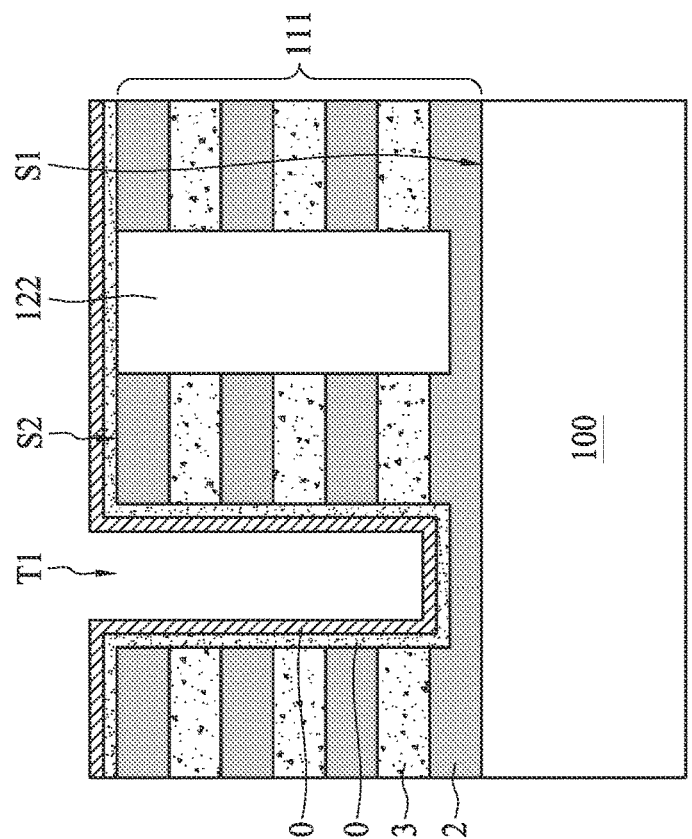
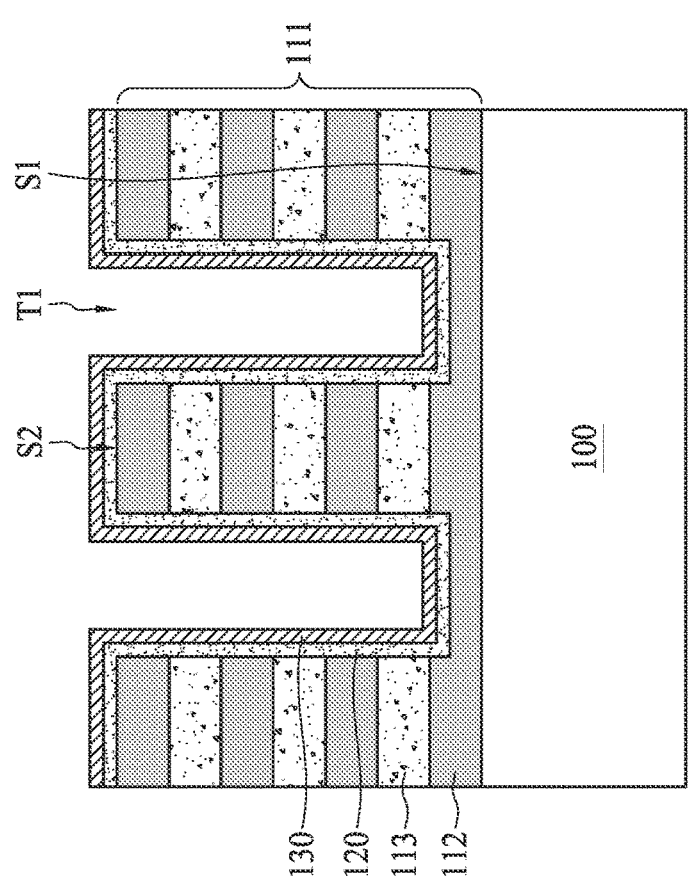
FIG. 15A
FIG. 15B

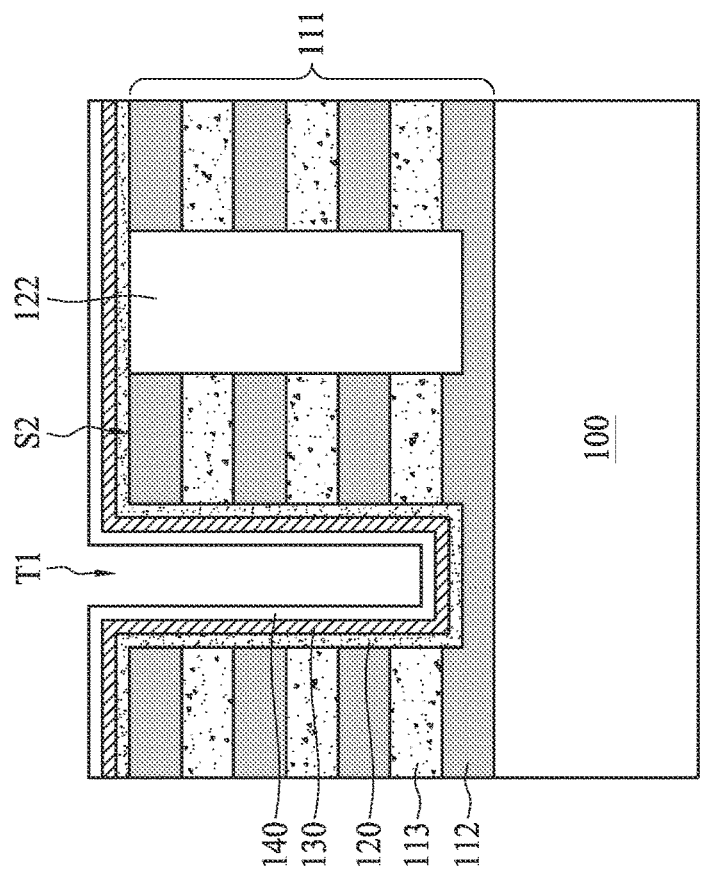
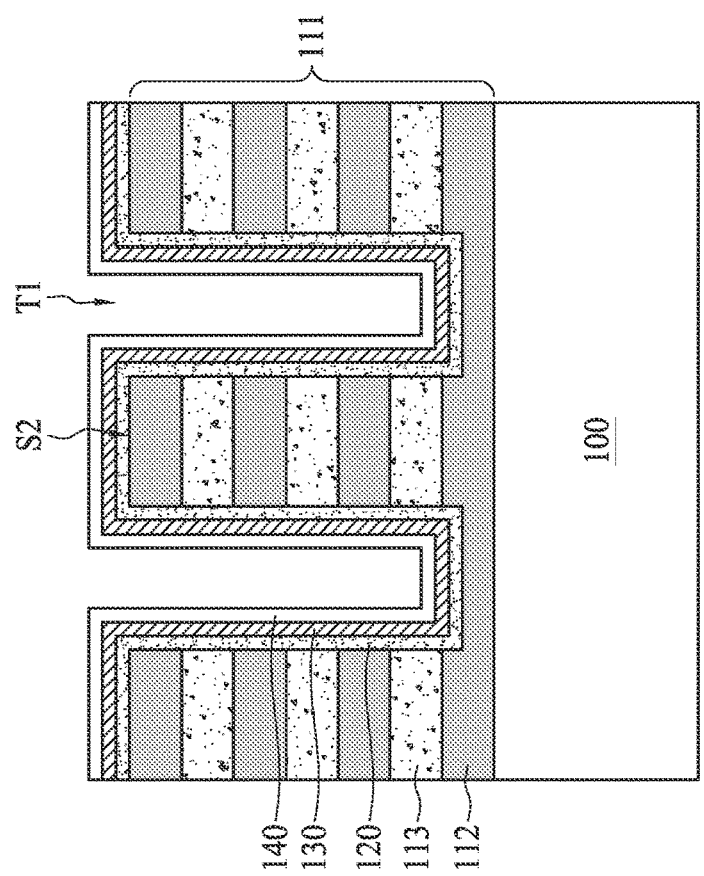
FIG. 17A
FIG. 17B

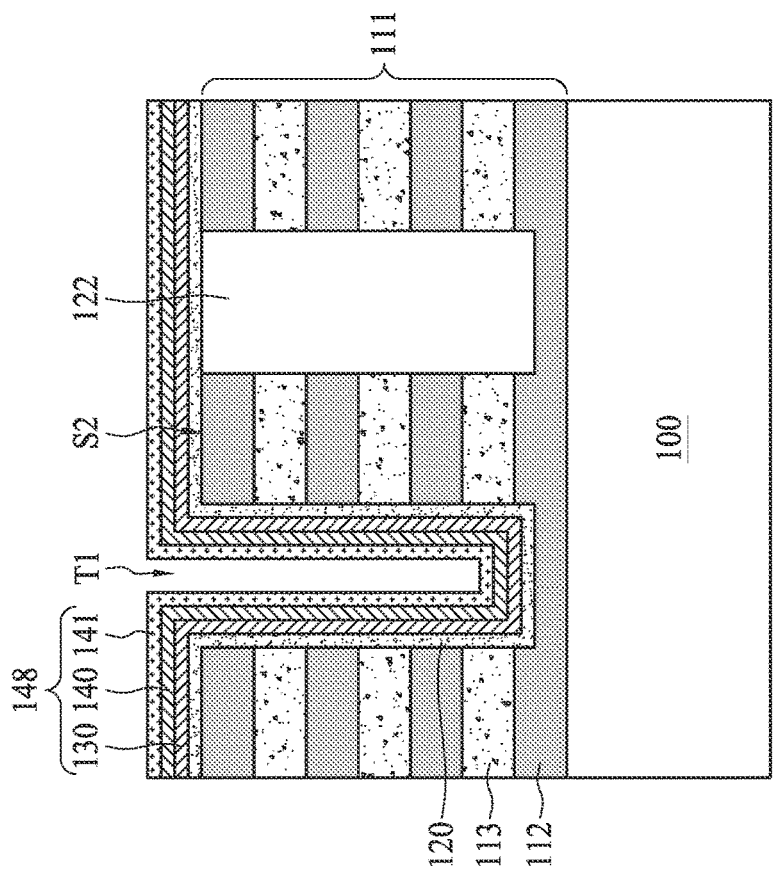
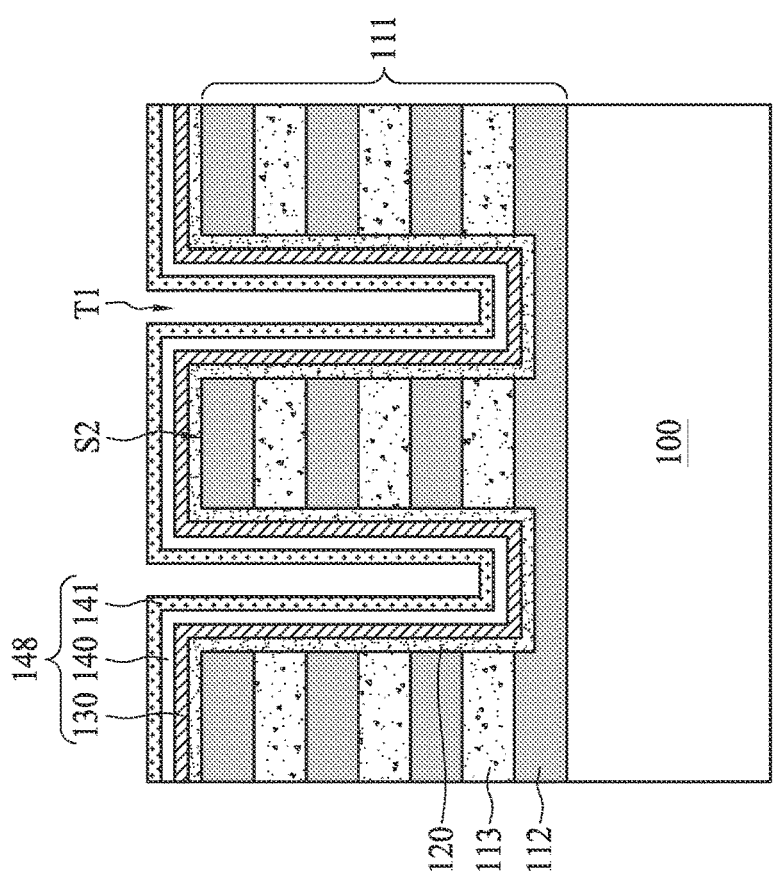

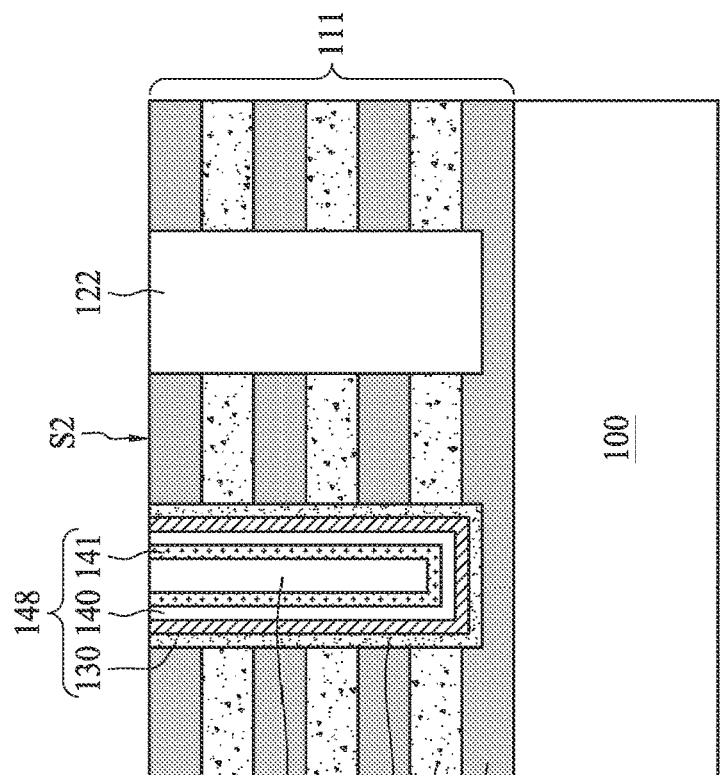
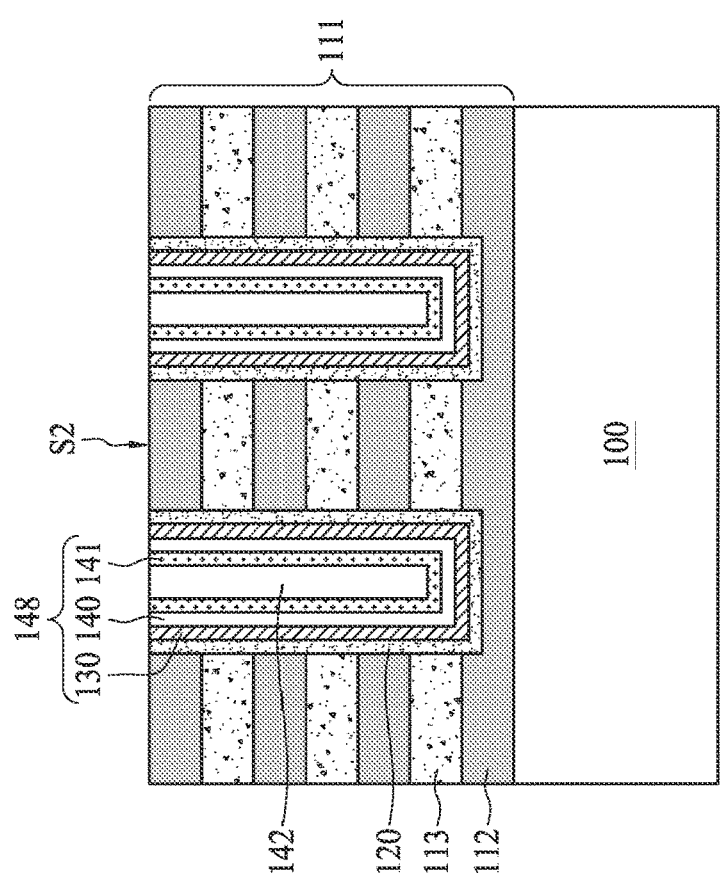

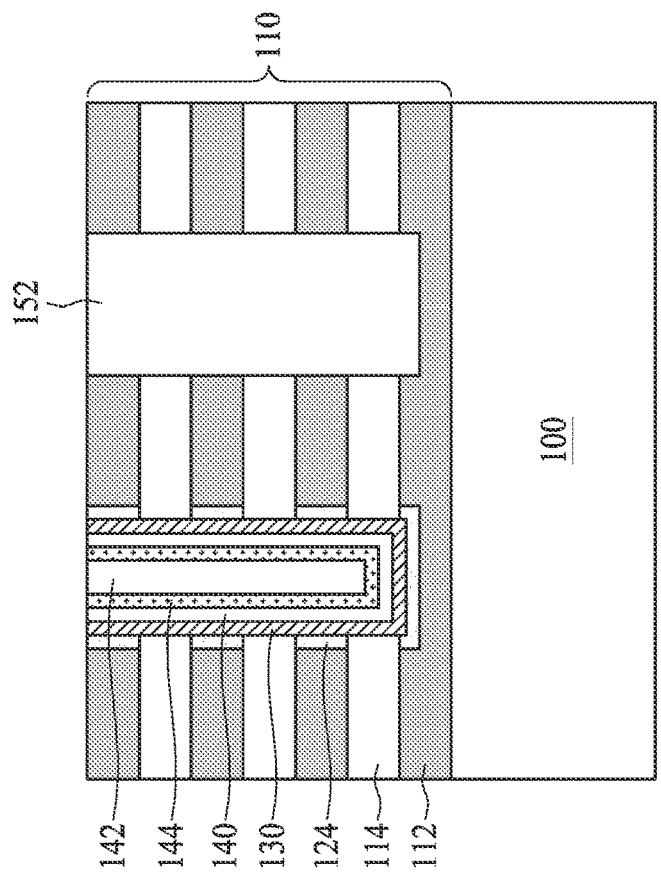
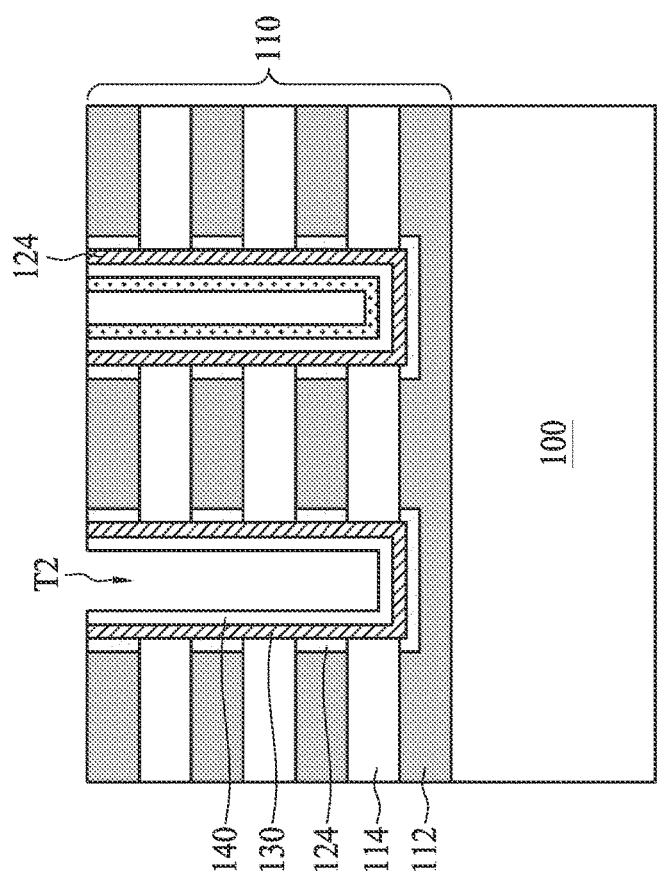
FIG. 33A
FIG. 33B

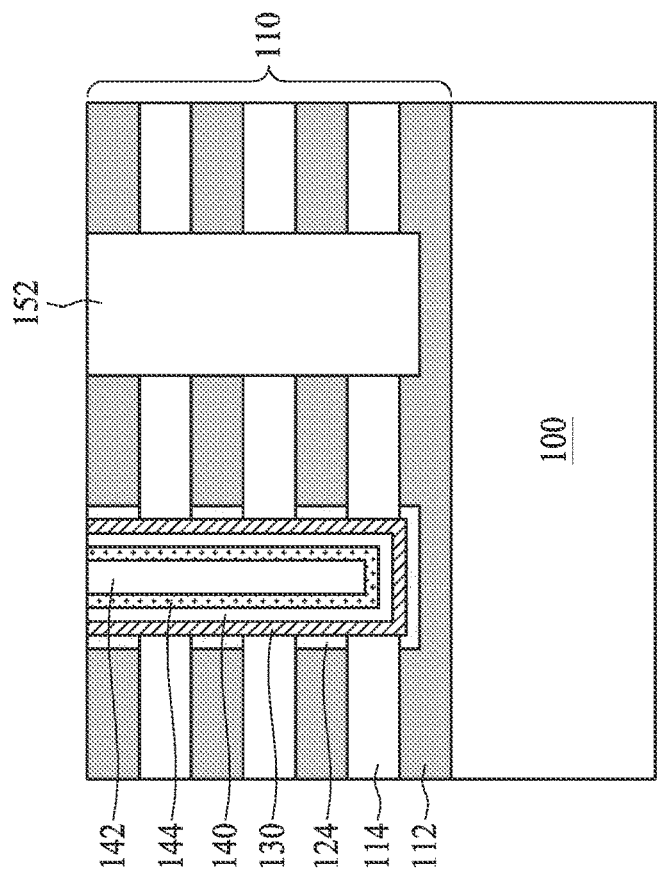
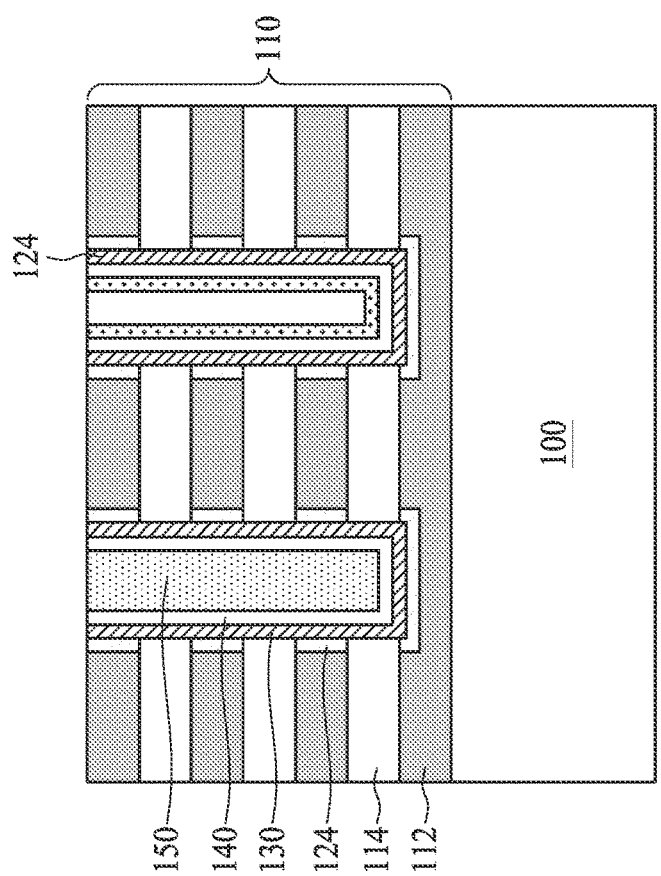
FIG. 35A
FIG. 35B

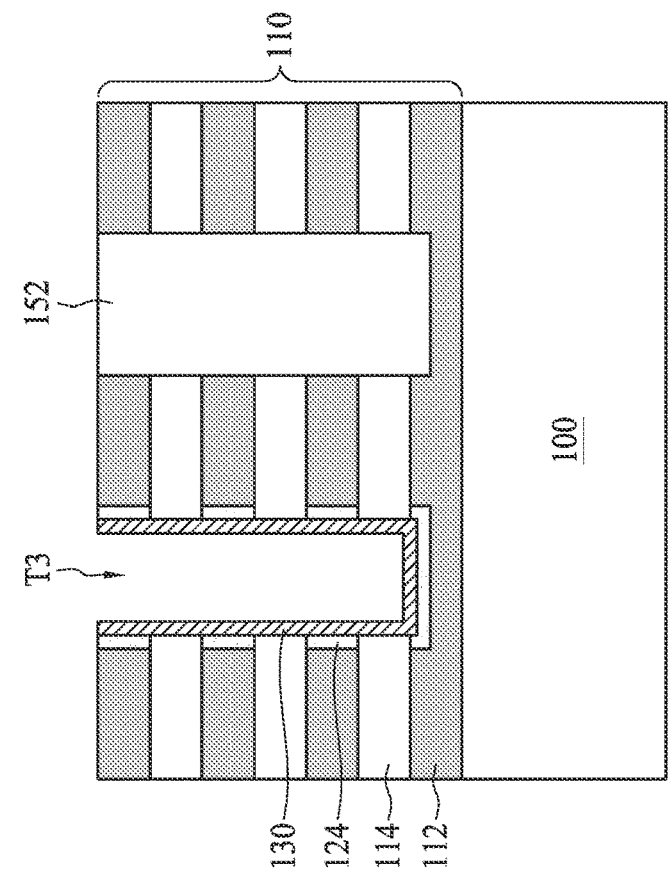
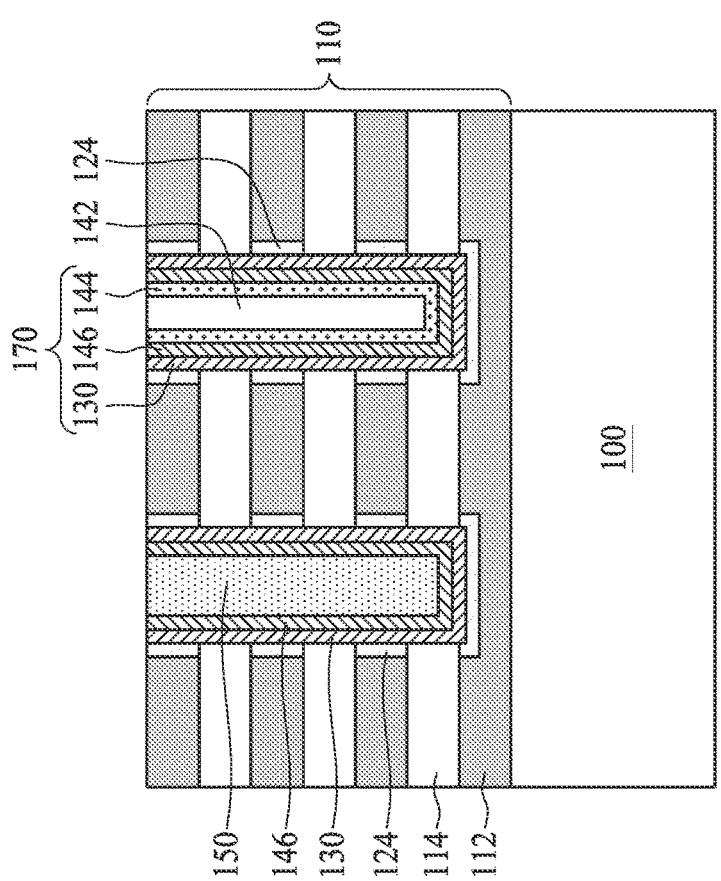
FIG. 37A
FIG. 37B

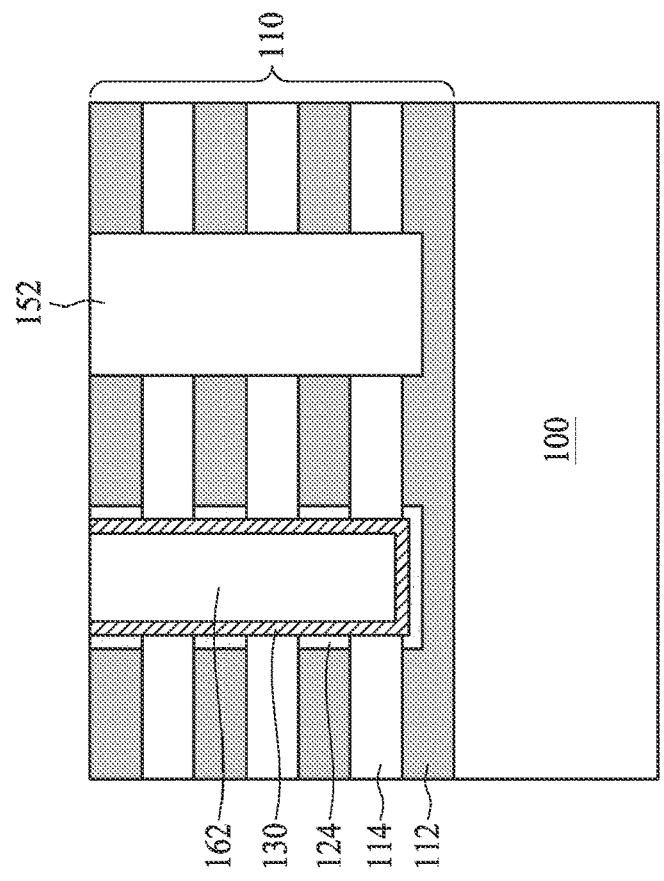
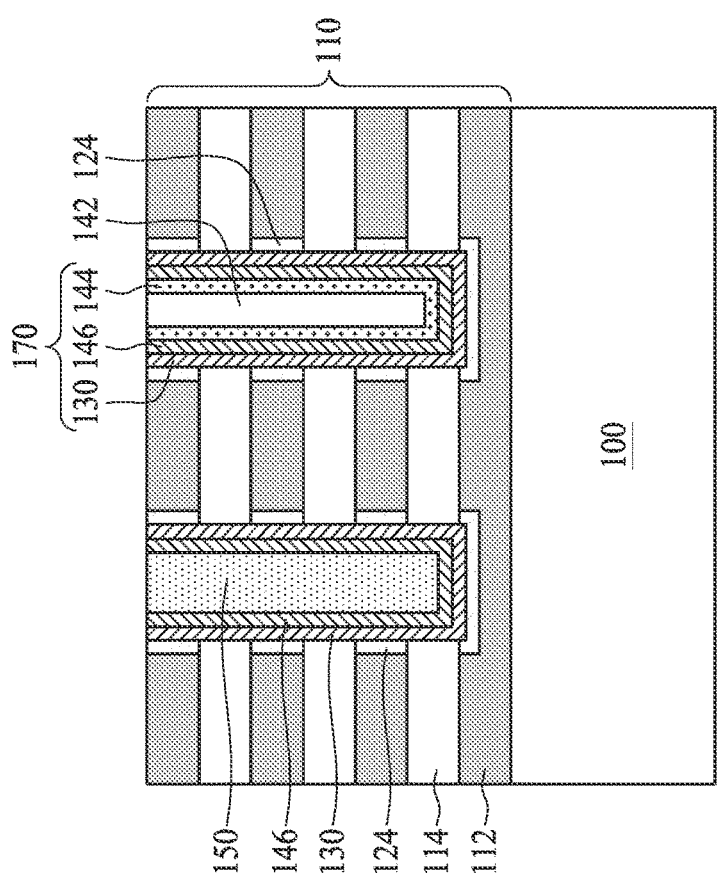
FIG. 39A
FIG. 39B

SEMICONDUCTOR STRUCTURE AND METHOD FOR FORMING THEREOF

REFERENCE TO RELATED APPLICATIONS

This application is a Divisional of U.S. application Ser. No. 17/345,499, filed on Jun. 11, 2021, which claims the benefit of U.S. Provisional Application No. 63/167,788, filed on Mar. 30, 2021. The contents of the above-referenced Patent Applications are hereby incorporated by reference in their entirety.

BACKGROUND

Ferroelectric memory has received attention as a nonvolatile memory capable of high-speed operation. The ferroelectric memory is a memory that uses polarization of a ferroelectric material to store data. A non-limiting example of such a ferroelectric material is hafnium silicate ($HfSiO_x$). However, ferroelectric materials may be sensitive to etching processes and other semiconductor processes used to form ferroelectric memory. As a result, there is a demand for improvements in fabrication processes for forming ferroelectric memory.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

FIGS. 7A and 7B are schematic cross-sectional views respectively taken along line A-A' and line B-B' shown in FIG. 6, in accordance with some embodiments of the present disclosure.

FIGS. 11A and 11B are schematic cross-sectional views respectively taken along line A-A' and line B-B' shown in FIG. 10, in accordance with some embodiments of the present disclosure.

FIGS. 13A and 13B are schematic cross-sectional views respectively taken along line A-A' and line B-B' shown in FIG. 12, in accordance with some embodiments of the present disclosure.

FIGS. 15A and 15B are schematic cross-sectional views respectively taken along line A-A' and line B-B' shown in FIG. 14, in accordance with some embodiments of the present disclosure.

FIGS. 17A and 17B are schematic cross-sectional views respectively taken along line A-A' and line B-B' shown in FIG. 16, in accordance with some embodiments of the present disclosure.

FIGS. 19A and 19B are schematic cross-sectional views respectively taken along line A-A' and line B-B' shown in FIG. 18, in accordance with some embodiments of the present disclosure.

FIGS. 22A and 22B are schematic cross-sectional views respectively taken along line A-A' and line B-B' shown in FIG. 21, in accordance with some embodiments of the present disclosure.

FIGS. 33A and 33B are schematic cross-sectional views respectively taken along line A-A' and line B-B' shown in FIG. 32, in accordance with some embodiments of the present disclosure.

FIGS. 35A and 35B are schematic cross-sectional views respectively taken along line A-A' and line B-B' shown in FIG. 34, in accordance with some embodiments of the present disclosure.

FIGS. 37A and 37B are schematic cross-sectional views respectively taken along line A-A' and line B-B' shown in FIG. 36, in accordance with some embodiments of the present disclosure.

FIGS. 39A and 39B are schematic cross-sectional views respectively taken along line A-A' and line B-B' shown in FIG. 38, in accordance with some embodiments of the present disclosure.

DETAILED DESCRIPTION

Figure 1A:
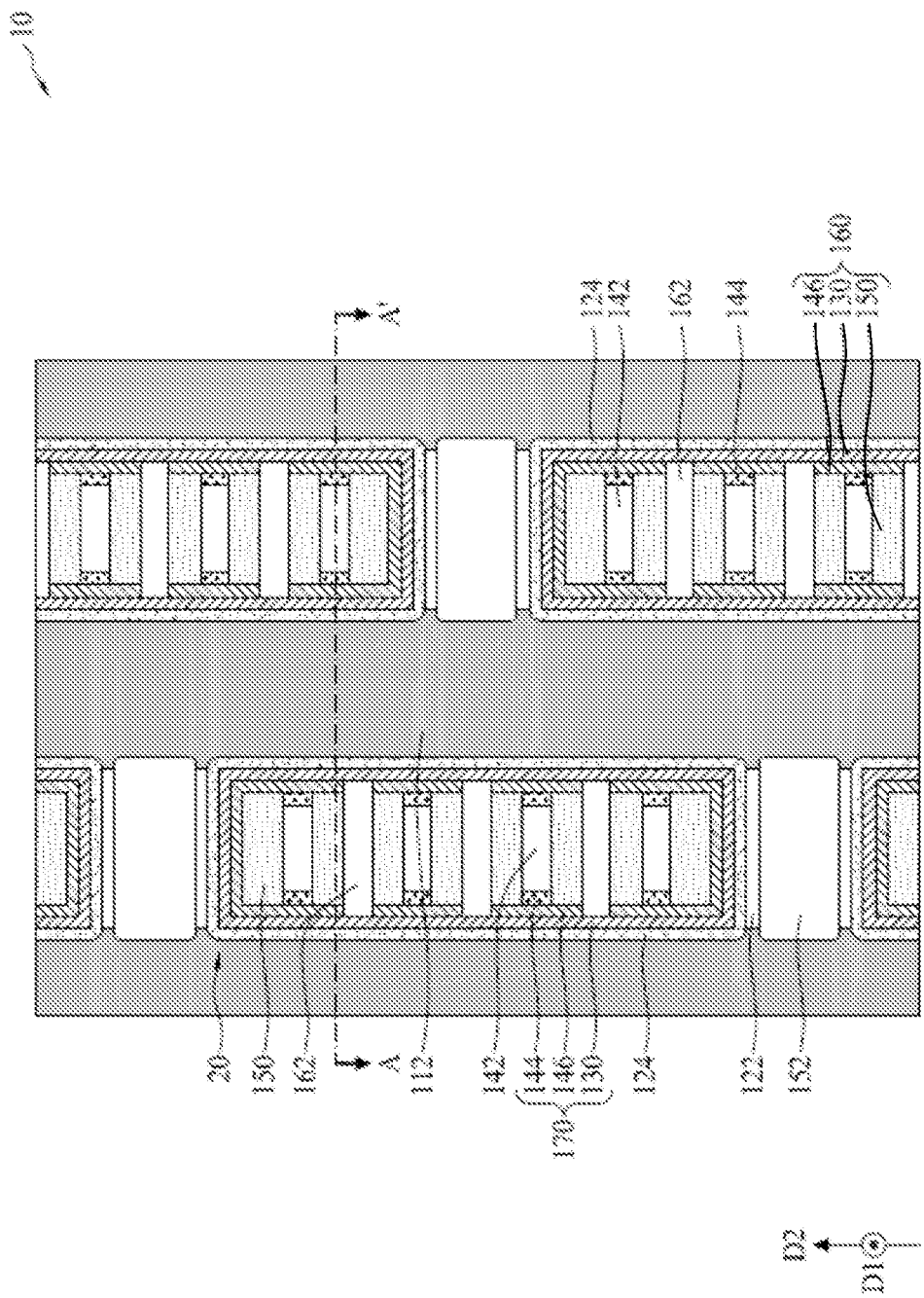
FIG. 1A is a schematic top view of a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In some embodiments, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally mean within a value or range which can be contemplated by people having ordinary skill in the art. Alternatively, the terms "substantially," "approximately," or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

It is an advantage of a ferroelectric memory device that by using a ferroelectric material, the voltage drop over an interfacial layer between the ferroelectric layer and a channel layer in the memory device is reduced. Therefore, the efficiency of the applied voltage can be increased. However, many semiconductor processes may damage the ferroelectric material when fabricating the ferroelectric memory device, especially an etching process. As a result, there is a need to improve the semiconductor process using the ferroelectric material.

Figure 1B:
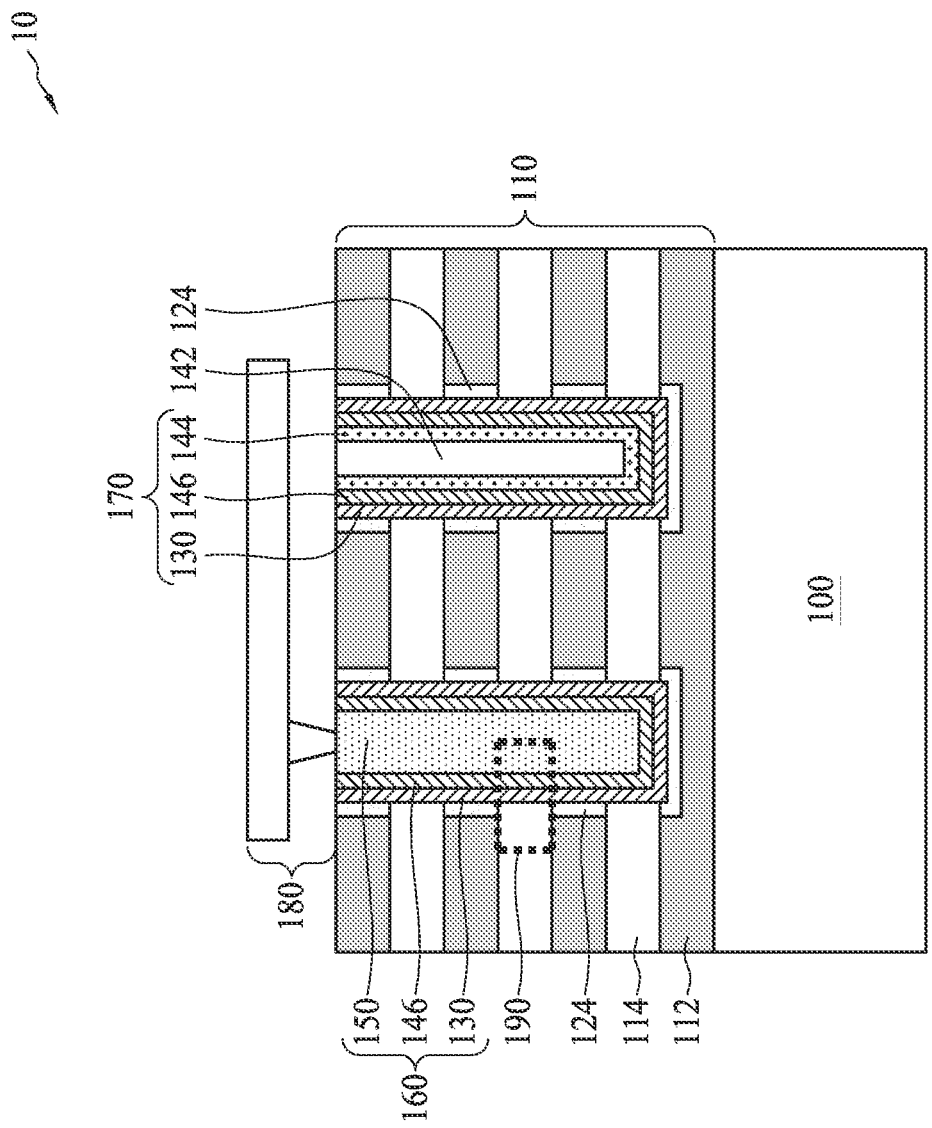
FIG. 1B is a schematic cross-sectional view of the semiconductor structure taken along line A-A' shown in FIG. 1A, in accordance with some embodiments of the present disclosure.

The present disclosure provides a semiconductor structure and a method for fabricating a semiconductor structure. FIG. 1A is a schematic top view of a semiconductor structure 10, in accordance with some embodiments of the present disclosure. FIG. 1B is a schematic cross-sectional view of the semiconductor structure 10 taken along line A-A' shown in FIG. 1A, in accordance with some embodiments of the present disclosure. Some components of the semiconductor structure 10 are not shown in each of the schematic top view and schematic cross-sectional view for purposes of clarity.

Referring to FIG. 1A, the semiconductor structure 10 includes multiple memory units 20. The memory units 20 are separated from each other by an insulating layer 112 and dielectric members 122, 152 along a thickness direction D1. The memory units 20 extend along a length direction D2 perpendicular to the thickness direction D1. A liner member 124 may surround at least a portion of a memory unit 20. The memory unit 20 includes multiple core structures 160 and multiple layered structures 170. A core structure 160 includes a memory layer 130, a channel member 146 on the memory layer 130, and a contact member 150 on the channel member 146. The channel member 146 may be surrounded by the memory layer 130. A layered structure 170 includes a memory layer 130, a channel member 146 on the memory layer 130, and a capping member 144 on the channel member 146. The capping member 144 may be surrounded by the channel member 146. Dielectric members 142, 162 are alternately arranged with other and are respectively alternately arranged with the contact member 150 from the top view.

Referring to FIG. 1B, the semiconductor structure 10 includes a substrate 100, a stacked structure 110 on the substrate 100, the core structure 160 in the stacked structure 110, the layered structure 170 in the stacked structure 110, and an interconnect structure 180 on the stacked structure 110. In some embodiments, the semiconductor structure 10 includes a ferroelectric memory device. The stacked structure 110 includes multiple alternately stacked insulating layers 112 and gate members 114. Each of the insulating layers 112 is horizontal to each of the gate members 114.

The core structure 160 may, for example, correspond to and partially define a vertical stack of individual memory cells 190. Multiple memory cells 190 are disposed at interfaces between the stacked structure 110 and the core structure 160. Each of the memory cells 190 includes a gate member 114, a portion of the memory layer 130 confronted with the gate member 114, a portion of the channel member 146 corresponding to the portion of the memory layer 130, and a portion of the contact member 150 corresponding to the portion of the channel member 146. Referring back to FIG. 1A, each memory cell 190 includes a pair of core structures 160, in which one is used as a source line (SL) and the other is used as a bit line (BL). In addition, in each memory cell 190, the channel member 146 extends between the pair of core structures 160.

The individual memory cells 190 may, for example, be ferroelectric memory cells or some other suitable type of memory cell. The contact member 150 may, for example, correspond to a BL or an SL, and/or the gate members 114 may, for example, correspond word lines (WLs). In some embodiments, memory cells 190 of the semiconductor structure 10 are electrically coupled to WLs, SLs, and BLs with a NOR-type memory architecture. In addition, each memory cell 190 is connected to multiple contact members 150 (BLs) in parallel. In the NOR-type memory architecture, one end of each memory cell is connected to the SL, and the other end is connected to the BL, which resembles a NOR gate. The SL is used to connect to a power supply or the ground to trigger a flow of charges. The WL is used to control whether there is an electronic channel below the gate of the memory cell 190. The BL is used to detect whether the memory cell 190 is turned on by reading a bit of data to be 0 or 1.

Still referring to FIG. 1B, the interconnect structure 180 is disposed on the contact member 150 of the core structure 160. The interconnect structure 180 may include a vertical metallic member and a horizontal metallic member on the vertical metallic member. The interconnect structure 180 is electrically coupled to the contact member 150.

The semiconductor structure 10 includes multiple liner members 124 disposed in the stacked structure 110. The liner members 124 are alternately arranged with the gate members 114. Each of the liner members 124 surrounds a portion of the core structure 160 or a portion of the layered structure 170. Each of the liner members 124 also surrounds a portion of one of the insulating layers 112. Each of the liner members 124 is substantially between the core structure 160 or the layered structure 170 and one of the insulating layers 112. Each of the liner members 124 may be in contact with the memory layer 130. Each of the liner members has a thickness of about 1 nanometer (nm) and about 50 nm.

Figure 2:
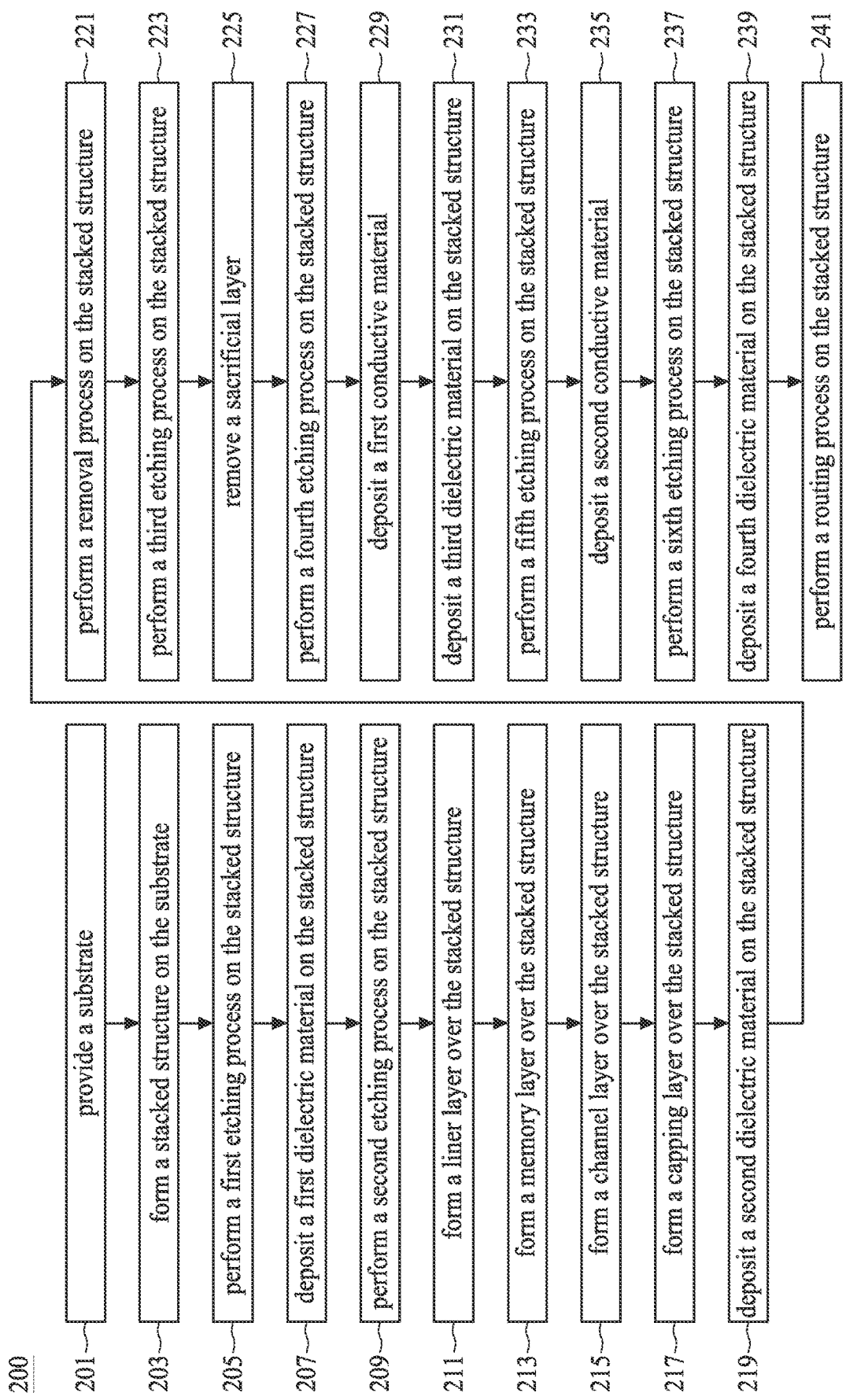
FIG. 2 is a flow diagram showing a method for fabricating the semiconductor structure in FIG. 1, in accordance with some embodiments of the present disclosure.

FIG. 2 is a flow diagram showing a method 200 for fabricating the semiconductor structure 10 in FIG. 1, in accordance with some embodiments of the present disclosure. FIGS. 3 to 40 are schematic top views, cross-sectional views, or perspective views illustrating sequential operations of the method 200 in FIG. 2, in accordance with some embodiments of the present disclosure.

Figure 3:
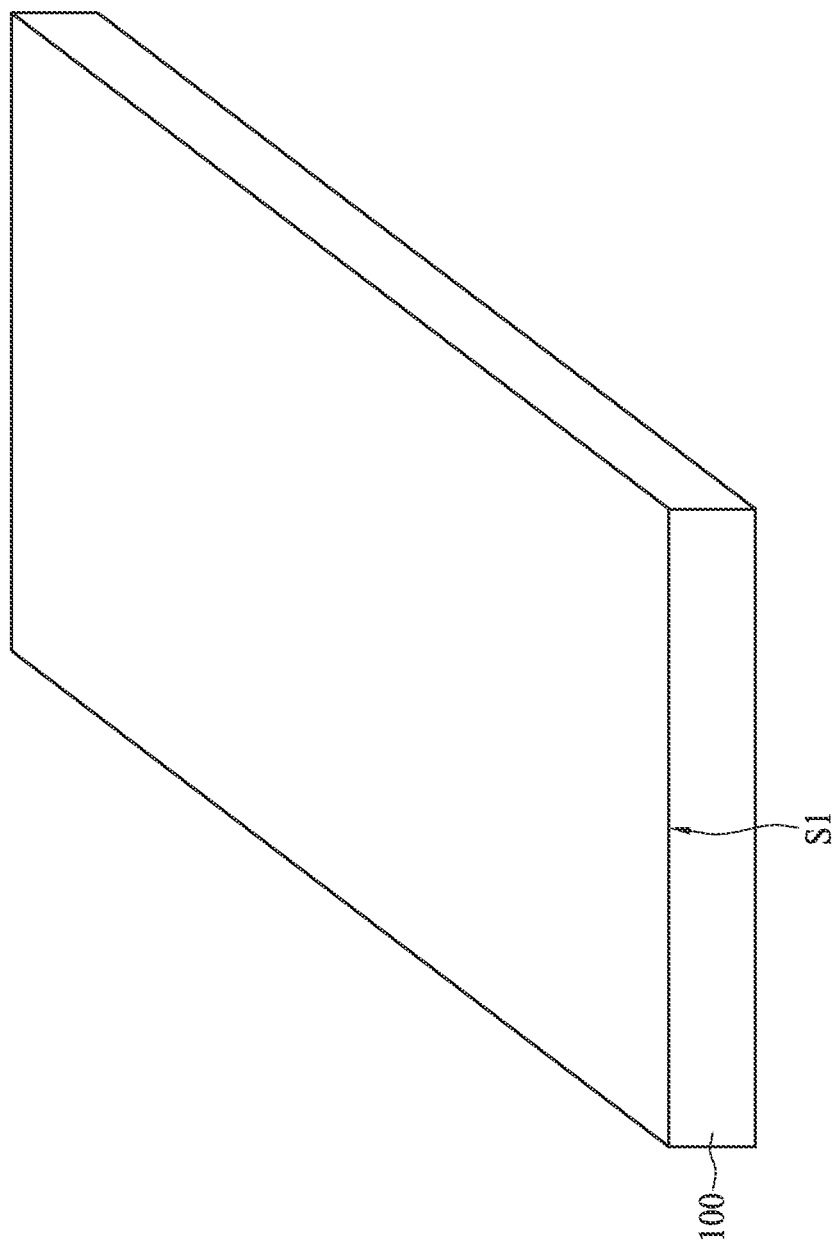
FIGS. 3 and 4 are schematic perspective views illustrating sequential operations of the method 200 in FIG. 2, in accordance with some embodiments of the present disclosure.

In operation 201, a substrate 100 is provided, as shown in FIG. 3. The substrate 100 has a top surface S1. In some embodiments, the substrate 100 is a semiconductor substrate such as a silicon, a gallium arsenide (GaAs), a gallium arsenide phosphide (GaAsP), an indium phosphide (InP), a germanium (Ge), or a silicon germanium (SiGe) substrate. Alternatively, the substrate 100 may be a p-type semiconductor substrate or an n-type semiconductor substrate.

Figure 4:
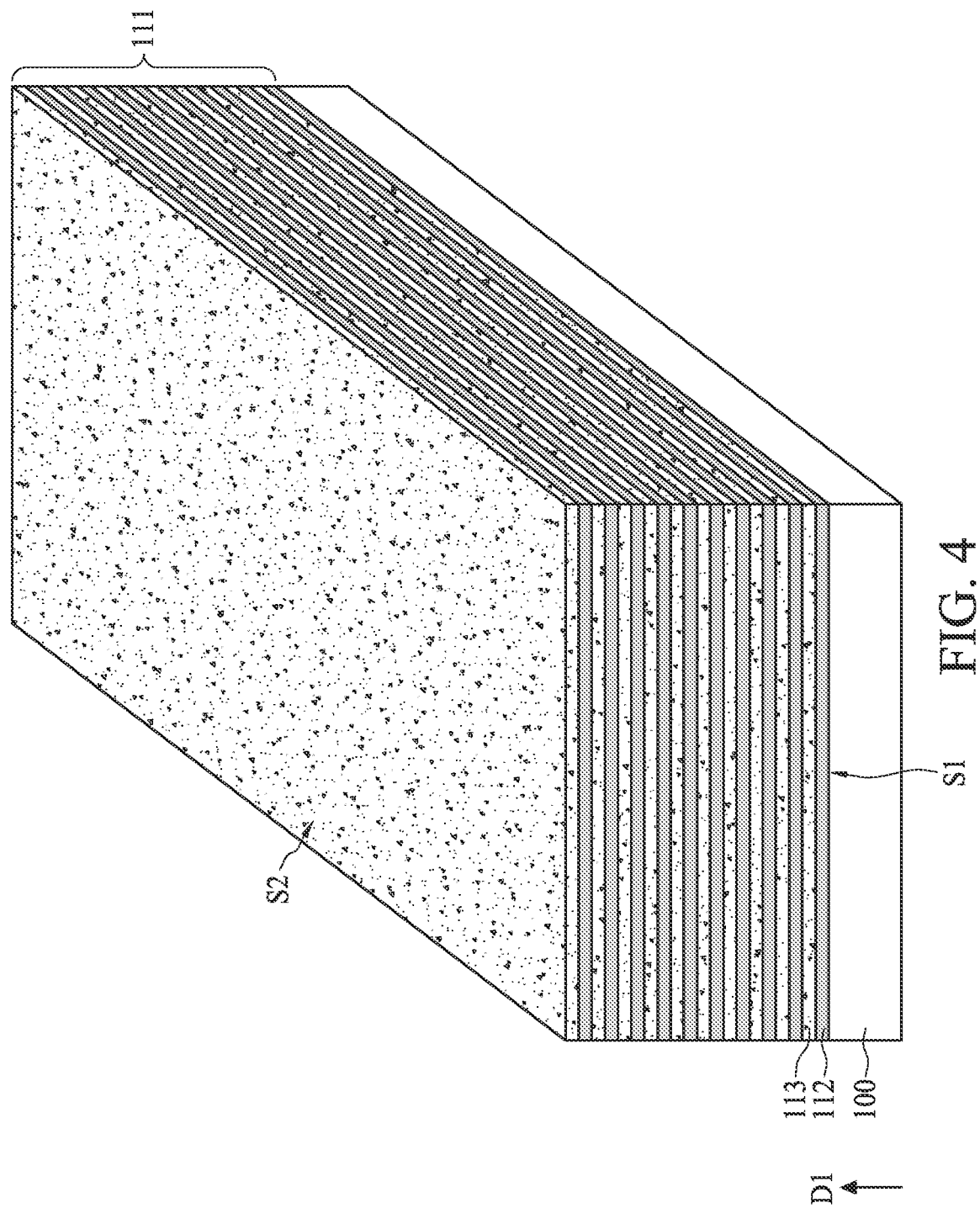
Figure 5:
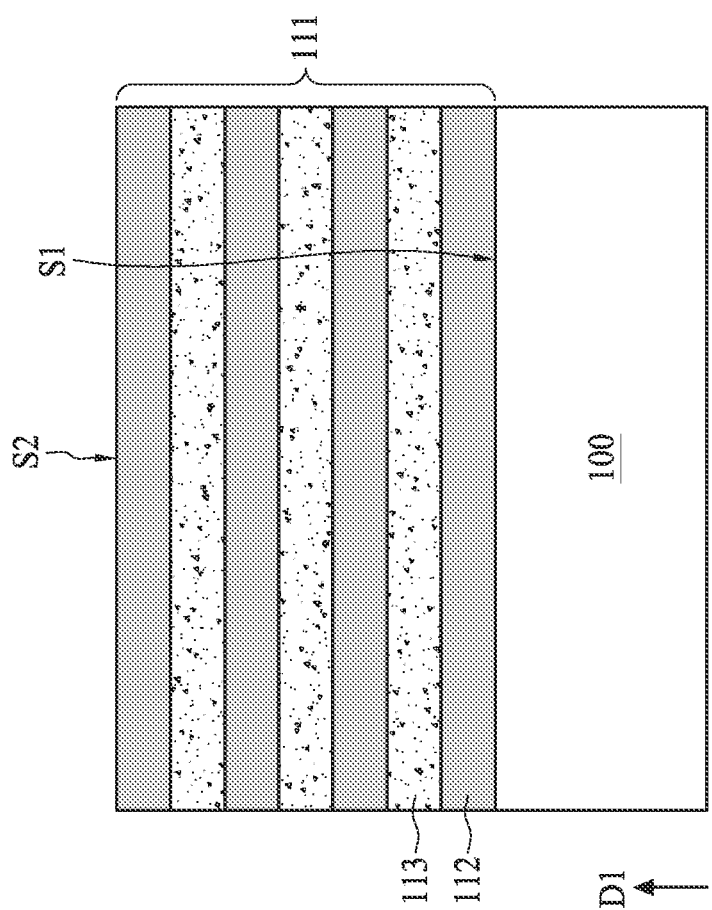
FIG. 5 is a schematic cross-sectional view of FIG. 4, in accordance with some embodiments of the present disclosure.

In operation 203, a stacked structure 111 is formed on the substrate 100, as shown in FIGS. 4 and 5. FIG. 4 is a schematic perspective view illustrating the stacked structure 111 disposed on the substrate 100. FIG. 5 is a schematic cross-sectional view of FIG. 4. The stacked structure 111 has a top surface S2 and includes multiple insulating layers 112 alternately stacked with multiple sacrificial layers 113. In some embodiments, the material of the insulating layers 112 includes a dielectric material such as silicon oxide ($SiO_2$). The material of the sacrificial layers 113 is different from the material of the insulating layers 112. In some embodiments, the material of the sacrificial layers 113 is silicon nitride ($Si_3N_4$). In such embodiments, the insulating layer 112 has an etching rate substantially different from an etching rate of the sacrificial layer 113. The insulating layers 112 and the sacrificial layers 113 may be formed, for example, using a plurality of deposition processes such as atomic layer deposition (ALD), physical vapor deposition (PVD) or chemical vapor deposition (CVD). In some embodiments, a thickness direction D1 of the insulating layers 112 and the sacrificial layers 113 is substantially perpendicular to the top surface S1 of the substrate 100. It should be noted that the number of the insulating layers 112 and the sacrificial layers 113 in FIG. 4 is only for reference and not limited to the embodiment shown in FIG. 4. The number of the insulating layers 112 and the sacrificial layers 113 in the stacked structure 111 depends on the design and density of a desired memory device. In some embodiments, the stacked structure 111 starts with the insulating layer 112 being deposited on the top surface S1, as shown in FIG. 5. In other embodiments, the stacked structure 111 may start with the sacrificial layer 113 being deposited on the top surface S1.

Figure 6:
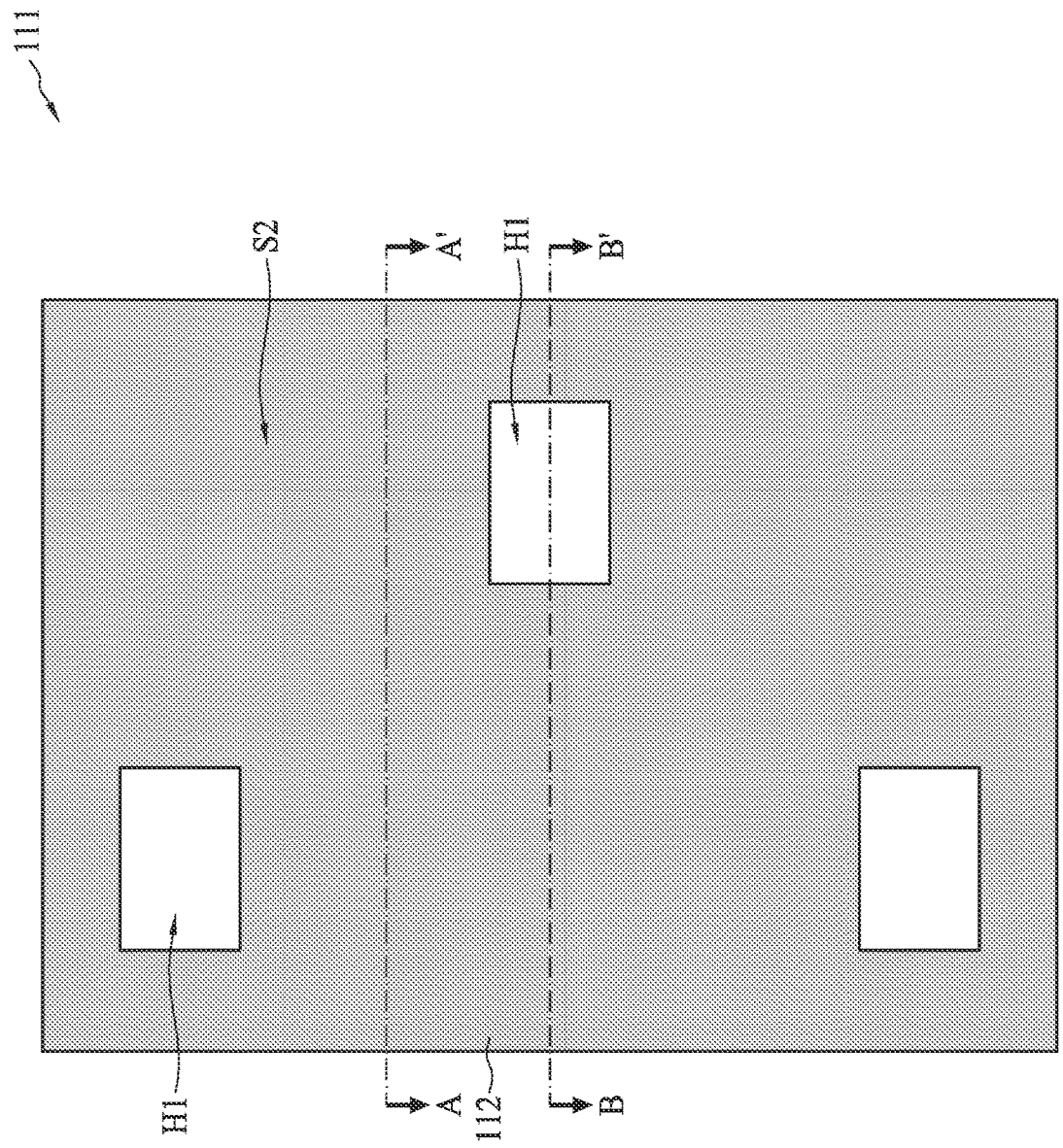
FIG. 6 is a schematic top view illustrating a sequential operation of the method 200 in FIG. 2, in accordance with some embodiments of the present disclosure.

In operation 205, a first etching process is performed on the stacked structure 111, as shown in FIG. 6. In some embodiments, the first etching process is a dry etching process or a reactive ion etching (RIE) process. The first etching process may vertically remove portions of the insulating layers 112 and the sacrificial layers 113. After the first etching process, multiple holes H1 may be formed in the stacked structure 111. In some embodiments, the holes H1 are staggered with each other in the stacked structure 111.

FIGS. 7A and 7B are schematic cross-sectional views respectively taken along line A-A' and line B-B' shown in FIG. 6. FIG. 7A shows a portion of the stacked structure 111 that is protected by a first photoresist (not shown) during the first etching process and thus not etched. FIG. 7B shows another portion of the stacked structure 111 in which the hole H1 is formed. The hole H1 may penetrate the top surface S2 and expose an inner sidewall W1 of the stacked structure 111. The inner sidewall W1 includes sidewalls of the alternately stacked insulating layers 112 and sacrificial layers 113. In some embodiments, the first etching process stops at the bottommost insulating layer 112 deposited on the top surface S1 of the substrate 100. The first etching process may partially remove the bottommost insulating layer 112. The profile of the hole H1 from the top view may be square, rectangular, circular, or some other suitable shape. In some embodiments, the hole H1 exposes the bottommost insulating layer 112 proximal to the substrate 100.

Figure 8:
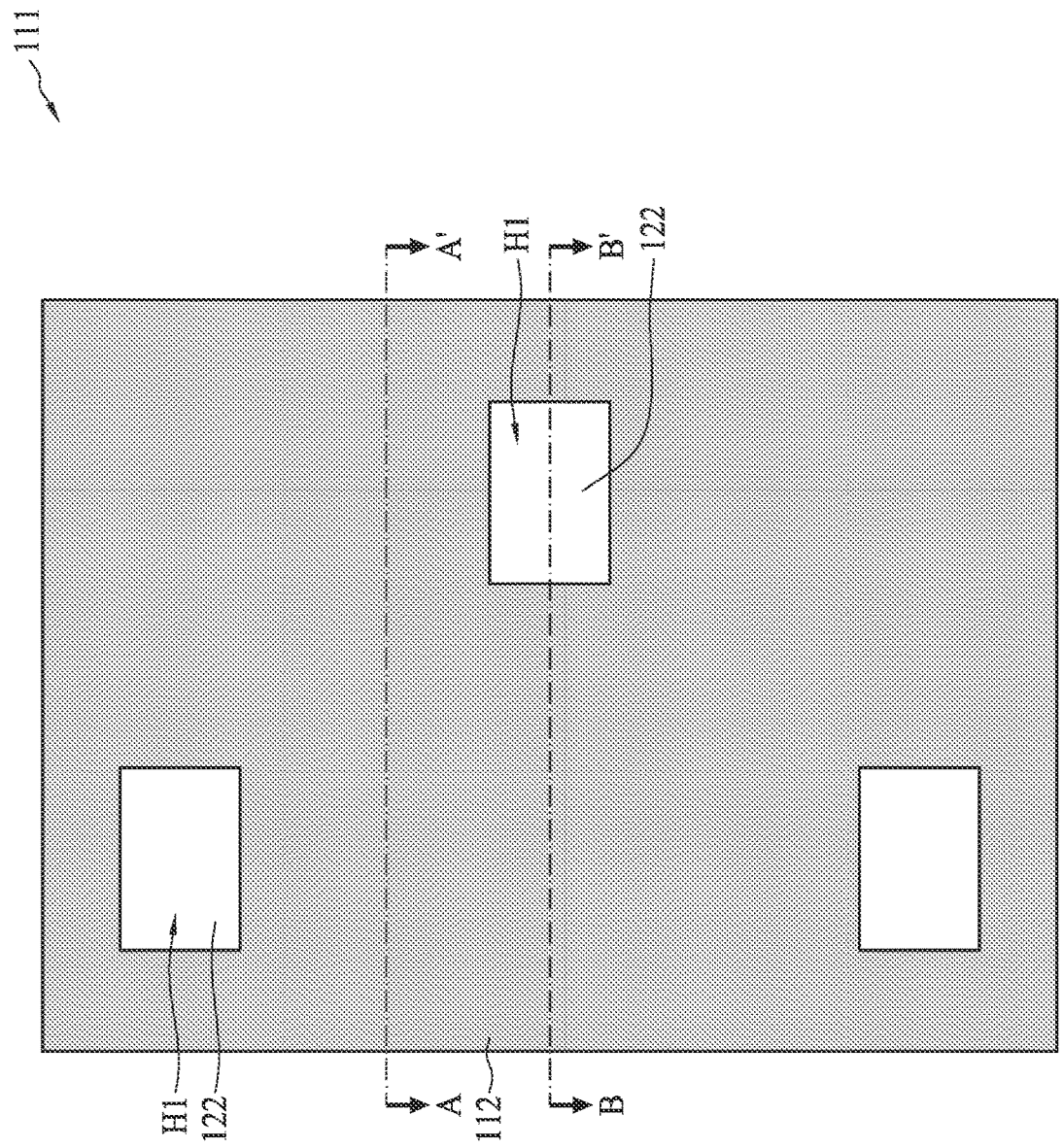
FIG. 8 is a schematic top view illustrating a sequential operation of the method 200 in FIG. 2, in accordance with some embodiments of the present disclosure.

In operation 207, a first dielectric material is deposited on the stacked structure 111, as shown in FIG. 8. The first dielectric material may be formed using a deposition process such as PVD or CVD. In some embodiments, the first dielectric material includes the same material as the insulating layers 112. In other embodiments, the first dielectric material includes phospho-silicate glass (PSG), boro-silicate glass (BSG), boron-doped phospho-silicate glass (BPSG), undoped silicate glass (USG), or the like. In some embodiments, the first dielectric material fills the hole H1 to form a first dielectric member 122. Multiple first dielectric members 122 may be formed and alternately arranged in the stacked structure 111. In some embodiments, the first dielectric member 122 is an isolation structure in the stacked structure 111.

Figure 9B:
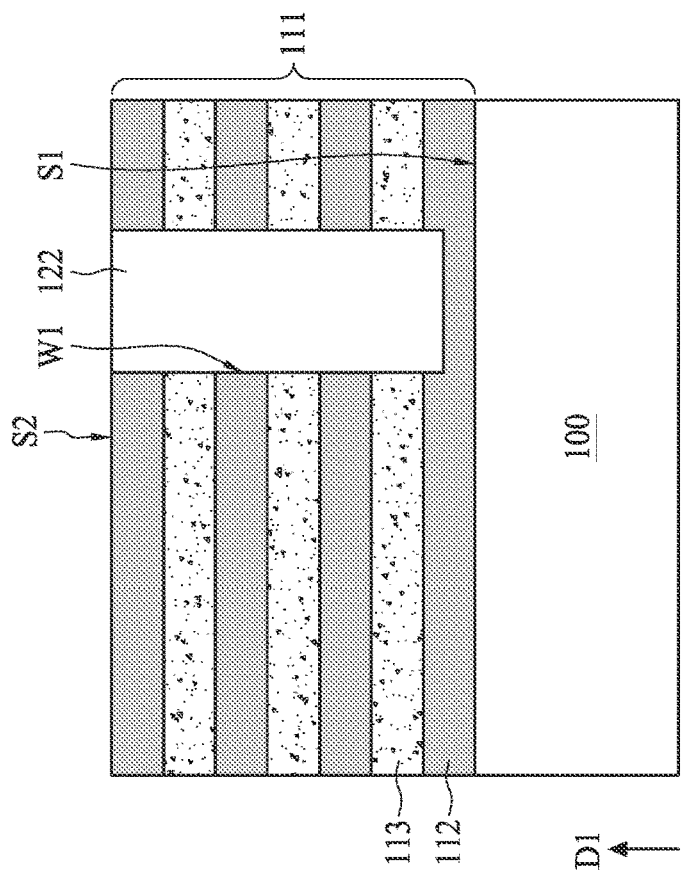
FIGS. 9A and 9B are schematic cross-sectional views respectively taken along line A-A' and line B-B' shown in FIG. 8, in accordance with some embodiments of the present disclosure.
Figure 9A:
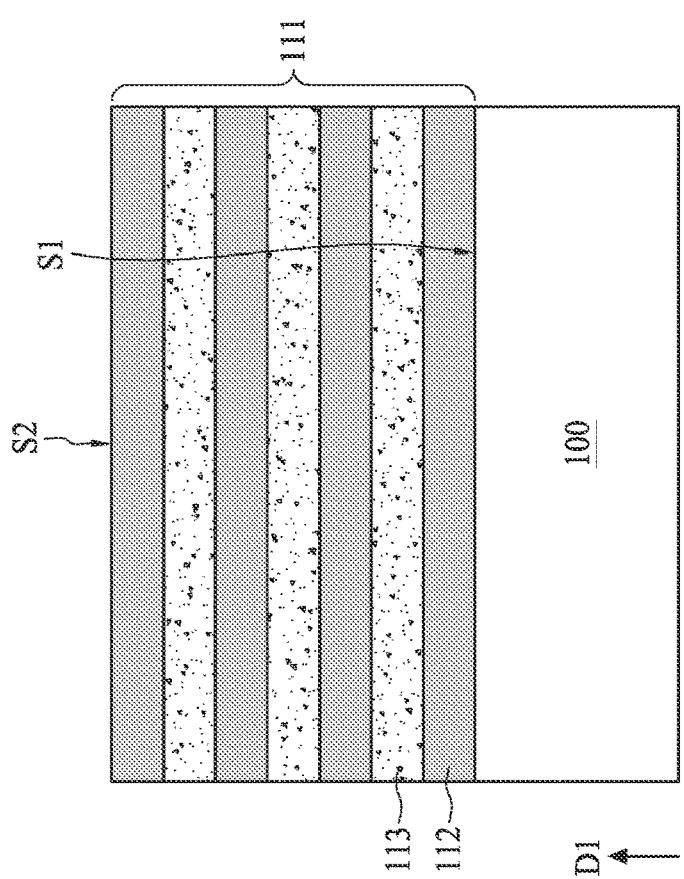

FIGS. 9A and 9B are schematic cross-sectional views respectively taken along line A-A' and line B-B' shown in FIG. 8. Referring to FIGS. 7B and 9B, the first dielectric member 122 covers the inner sidewall W1 and the bottommost insulating layer 112 over the substrate 100. After the hole H1 is completely filled, a chemical mechanical planarization (CMP) process or an etch-back process may be performed to remove excess first dielectric material over the stacked structure 111.

Figure 10:
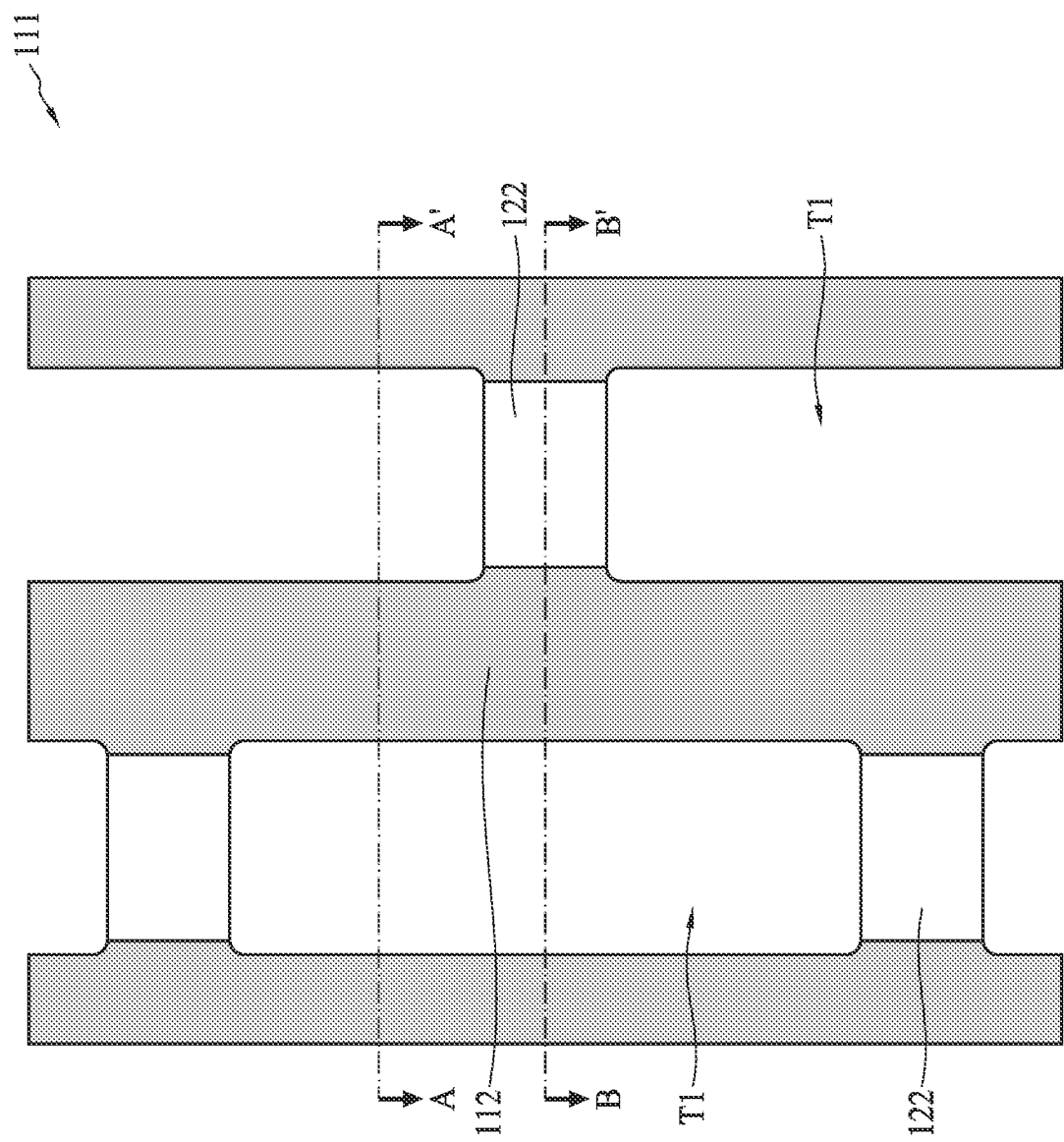
FIG. 10 is a schematic top view illustrating a sequential operation of the method 200 in FIG. 2, in accordance with some embodiments of the present disclosure.

In operation 209, a second etching process is performed on the stacked structure 111, as shown in FIG. 10. In some embodiments, the second etching process is a dry etching process or an RIE process. The second etching process may vertically remove portions of the insulating layers 112 and the sacrificial layers 113. After the second etching process, multiple trenches T1 may be formed and staggered with each other in the stacked structure 111. The trenches T1 may be alternately arranged with the dielectric members 122. In some embodiments, the trenches T1 extend along a length direction D2 perpendicular to the thickness direction D1.

FIGS. 11A and 11B are schematic cross-sectional views respectively taken along line A-A' and line B-B' shown in FIG. 10. FIG. 11A shows a portion of the stacked structure 111 in which multiple trenches T1 are formed from the cross-sectional view. A trench T1 may penetrate the top surface S2 and expose an inner sidewall W2 of the stacked structure 111. In some embodiments, the second etching process stops at the bottommost insulating layer 112 deposited on the top surface S1 of the substrate 100. The second etching process may partially remove the bottommost insulating layer 112. The profile of a trench T1 from the top view may be square, rectangular, circular, or some other suitable shape. In some embodiments, a trench T1 exposes the bottommost insulating layer 112 proximal to the substrate 100. In some embodiments, the depth of a trench T1 is substantially the same as the depth of the hole H1. In some embodiments, a trench T1 is substantially larger than the hole H1. FIG. 11B shows the dielectric members 122 and a portion of the stacked structure 111 that are protected by a second photoresist (not shown) during the second etching process and thus not etched.

Figure 12:
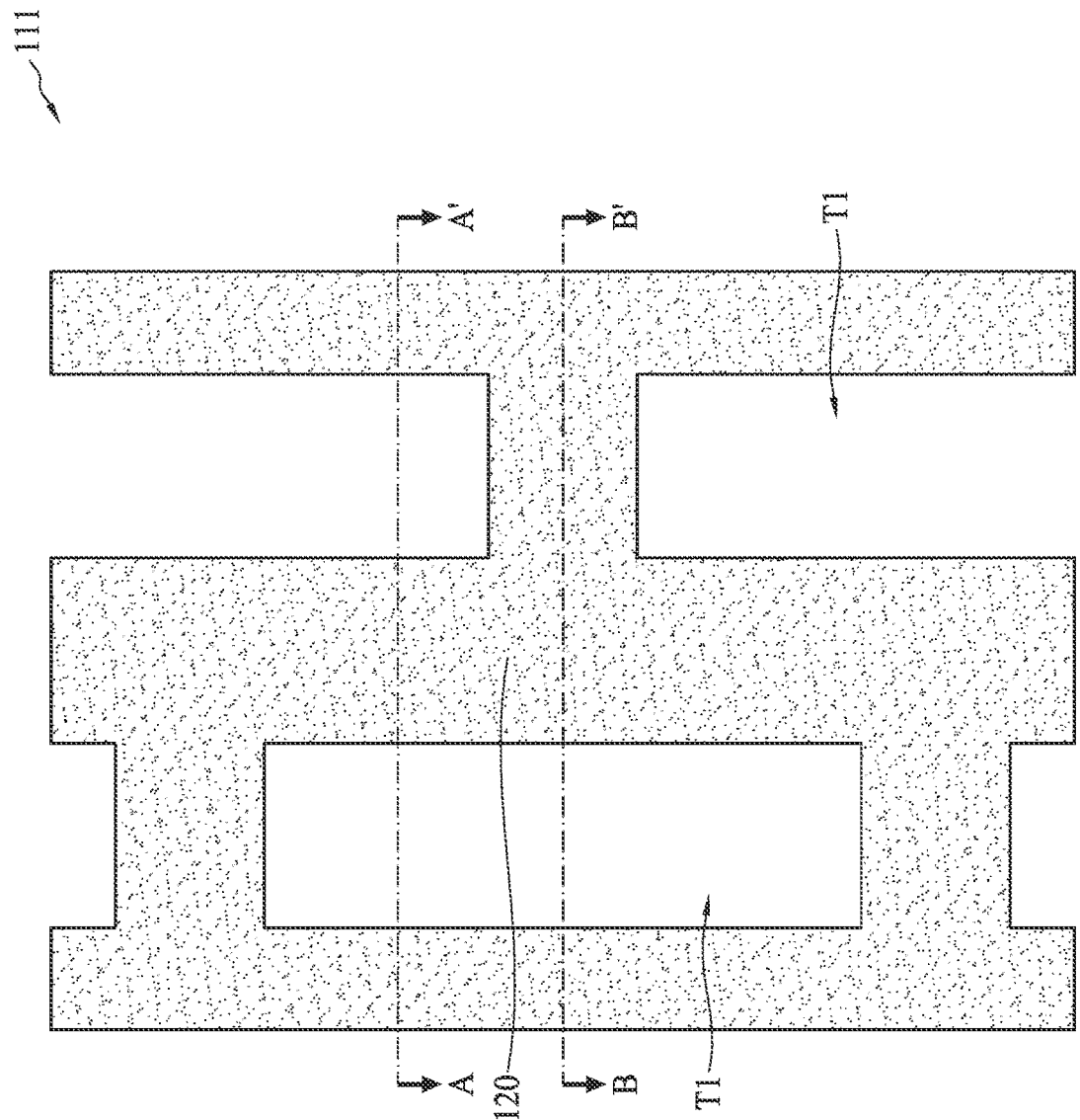
FIG. 12 is a schematic top view illustrating a sequential operation of the method 200 in FIG. 2, in accordance with some embodiments of the present disclosure.

In operation 211, a liner layer 120 is formed over the stacked structure 111, as shown in FIG. 12. The liner layer 120 is conformally formed in the trenches T1 using a deposition process such as ALD or CVD. In some embodiments, the liner layer is a single-layer structure. In other embodiments, the liner layer may be a multiple-layer structure formed by multiple deposition processes. In some embodiments, the material of the liner layer 120 includes undoped silicon, silicon carbide (SiC), silicon oxynitride (SiON), titanium oxide ($TiO_2$), hafnium oxide ($HfO_2$), zirconium oxide ($ZrO_2$) or other suitable materials. In some embodiments, the liner layer 120 has an etching rate substantially less than etching rates of the insulating layer 112 and the sacrificial layer 113 with respect to various etchants. Based on this, the etchants may be more reactive with the insulating layer 112 or the sacrificial layer 113 than the liner layer 120.

FIGS. 13A and 13B are schematic cross-sectional views respectively taken along line A-A' and line B-B' shown in FIG. 12. In some embodiments, the thickness of the liner layer 120 is between about 1 nm and 50 nm. The liner layer 120 may be formed on the inner sidewall W2 and the bottommost insulating layer 112 over the substrate 100, as shown in FIG. 13A or 13B. In some embodiments, the liner layer 120 is conformally formed in the trenches T1 and completely covers the inner sidewall W2 and the bottommost insulating layer 112. The liner layer 120 may be formed on the first dielectric member 122, as shown in FIG. 13B.

Figure 14:
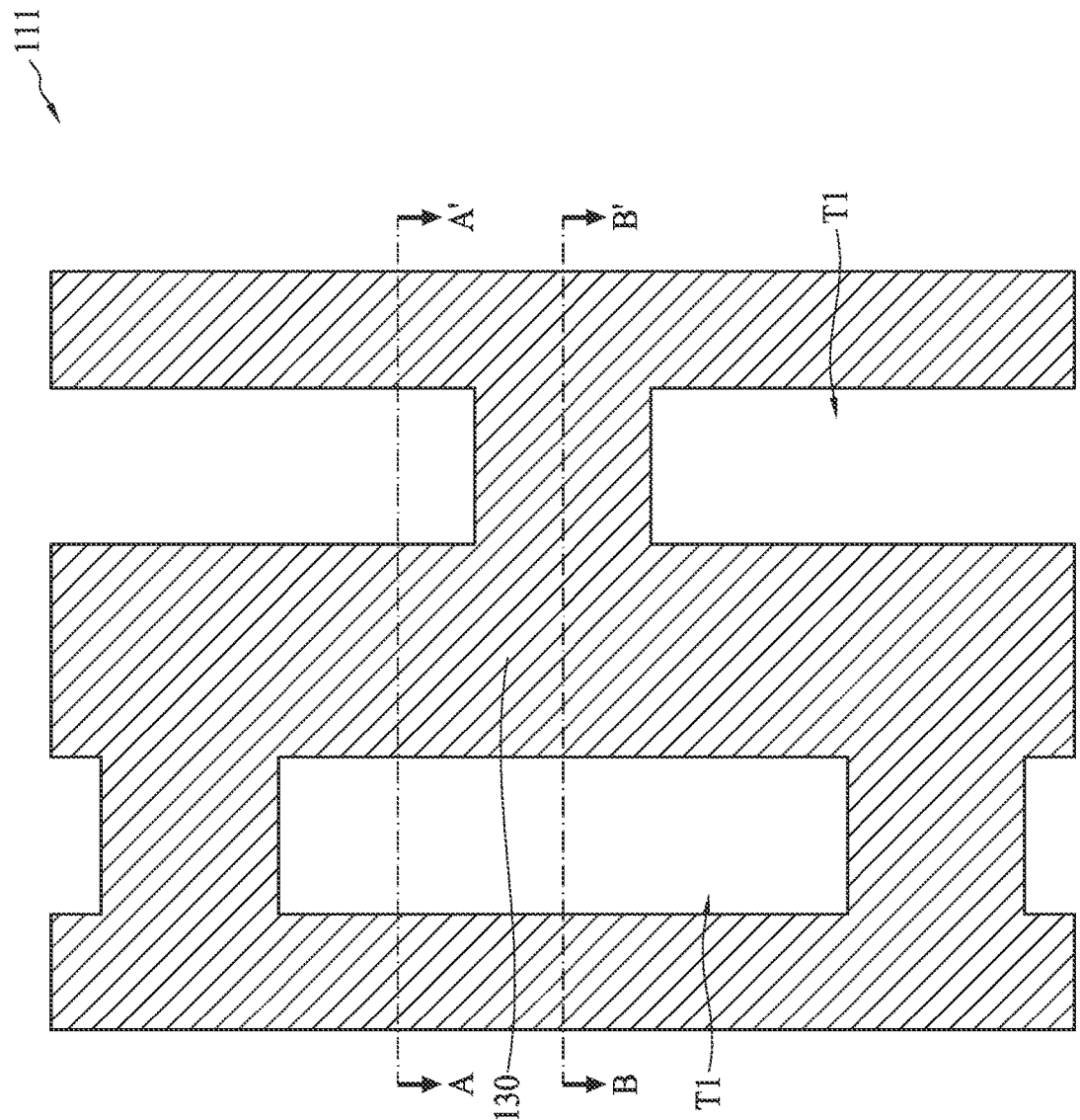
FIG. 14 is a schematic top view illustrating a sequential operation of the method 200 in FIG. 2, in accordance with some embodiments of the present disclosure.

In operation 213, a memory layer 130 is formed over the stacked structure 111, as shown in FIG. 14. The memory layer 130 is conformally formed in the trenches T1 using a deposition process such as ALD or CVD. In some embodiments, the material of the memory layer 130 includes a ferroelectric material such as hafnium oxide ($HfO_2$) doped with aluminum (Al), lanthanum (La), silicon (Si), zirconium (Zr) or tungsten-doped indium oxide (IWO). In some embodiments, the memory layer 130 has a polarization switching behavior when triggered by an external electrical field.

FIGS. 15A and 15B are schematic cross-sectional views respectively taken along line A-A' and line B-B' shown in FIG. 14. In some embodiments, the memory layer 130 is conformally formed on the liner layer 120. In such embodiments, the liner layer 120 surrounds the memory layer 130. Based on this, the memory layer 130 is not in direct contact with the insulating layers 112 and the sacrificial layers 113.

Figure 16:
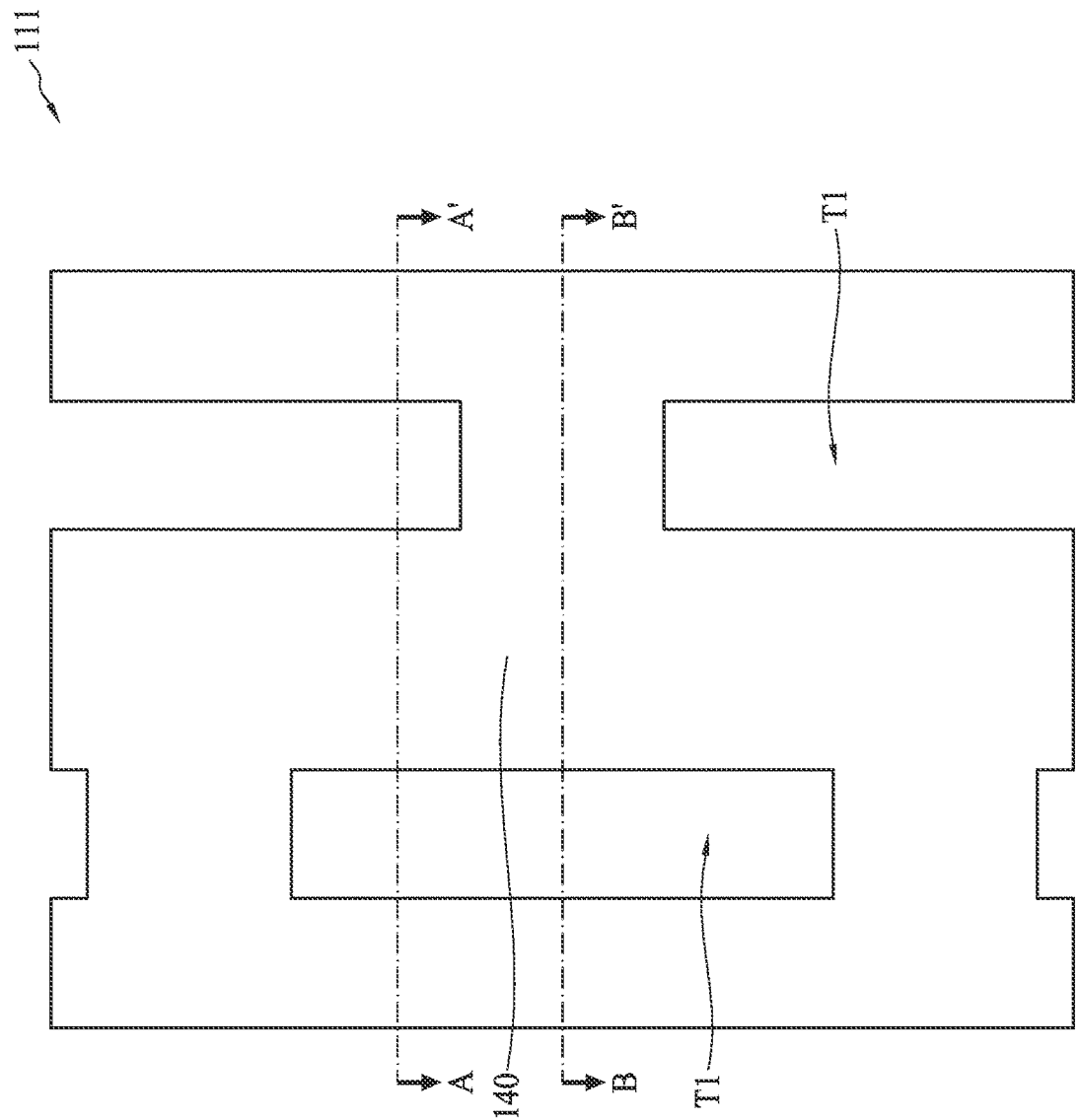
FIG. 16 is a schematic top view illustrating a sequential operation of the method 200 in FIG. 2, in accordance with some embodiments of the present disclosure.

In operation 215, a channel layer 140 is formed over the stacked structure 111, as shown in FIG. 16. The channel layer 140 is conformally formed in the trench T1 using a deposition process such as ALD or CVD. In some embodiments, the material of the channel layer 140 includes silicon (Si), germanium (Ge), silicon-germanium (SiGe), silicon oxide ($SiO_2$), III-V group compound semiconductors, or two-dimensional materials such as hexagonal boron nitride (hBN), graphene or other suitable materials.

FIGS. 17A and 17B are schematic cross-sectional views respectively taken along line A-A' and line B-B' shown in FIG. 16. In some embodiments, the channel layer 140 is conformally formed on the memory layer 130. In such embodiments, the memory layer 130 surrounds the channel layer 140.

Figure 18:
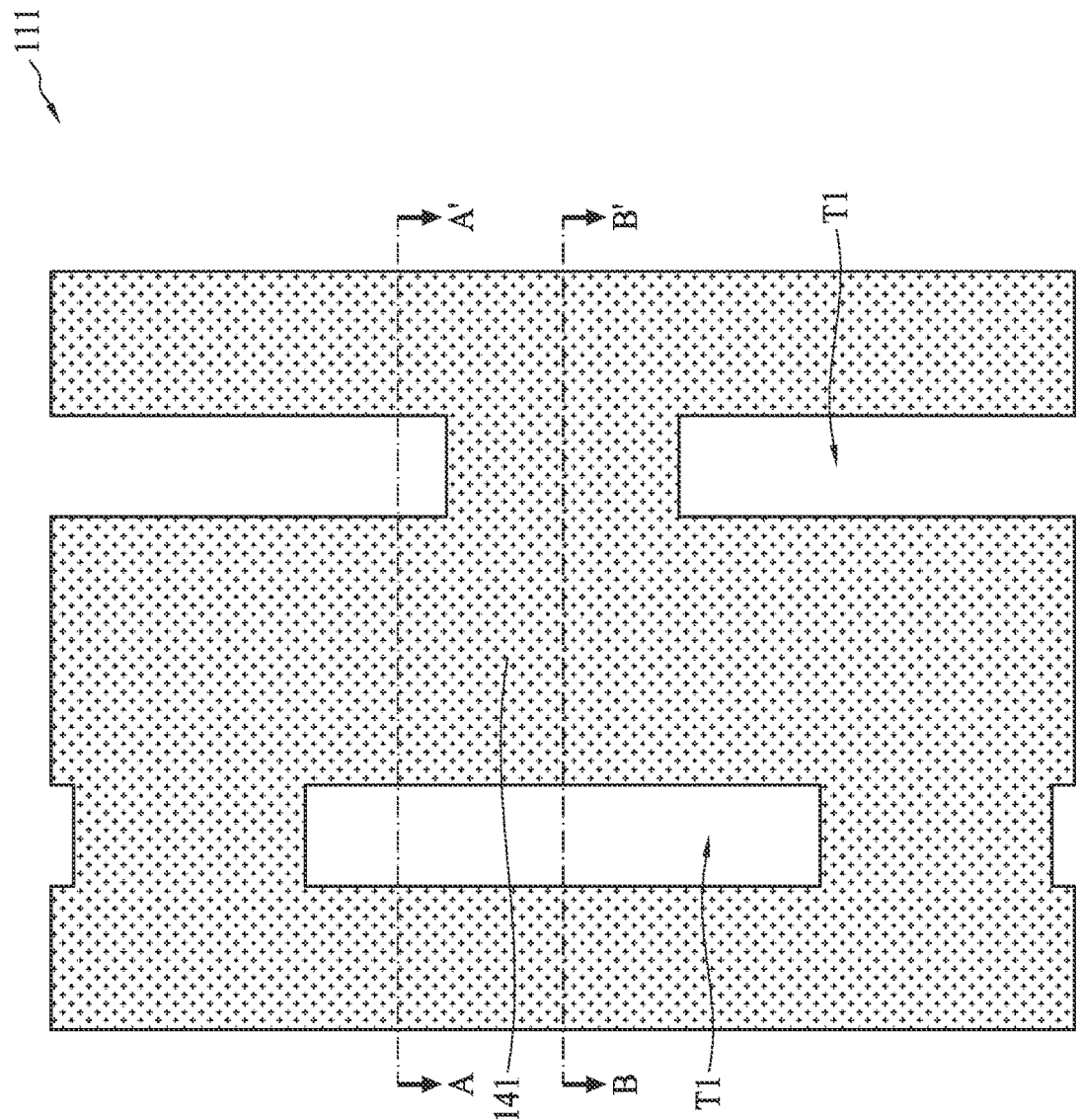
FIG. 18 is a schematic top view illustrating a sequential operation of the method 200 in FIG. 2, in accordance with some embodiments of the present disclosure.

In operation 217, a capping layer 141 is formed over the stacked structure 111, as shown in FIG. 18. The capping layer 141 is conformally formed in the trenches T1 using a deposition process such as ALD or CVD. In some embodiments, the material of the capping layer 141 includes aluminum oxide ($Al_2O_3$) or other suitable materials.

FIGS. 19A and 19B are schematic cross-sectional views respectively taken along line A-A' and line B-B' shown in FIG. 18. In some embodiments, the capping layer 141 is conformally formed on the channel layer 140. In such embodiments, the channel layer 140 surrounds the capping layer 141. In some embodiments, the memory layer 130, the channel layer 140 and the capping layer 141 form a layered structure 148 on the stacked structure 111.

Figures 20A, 20B:
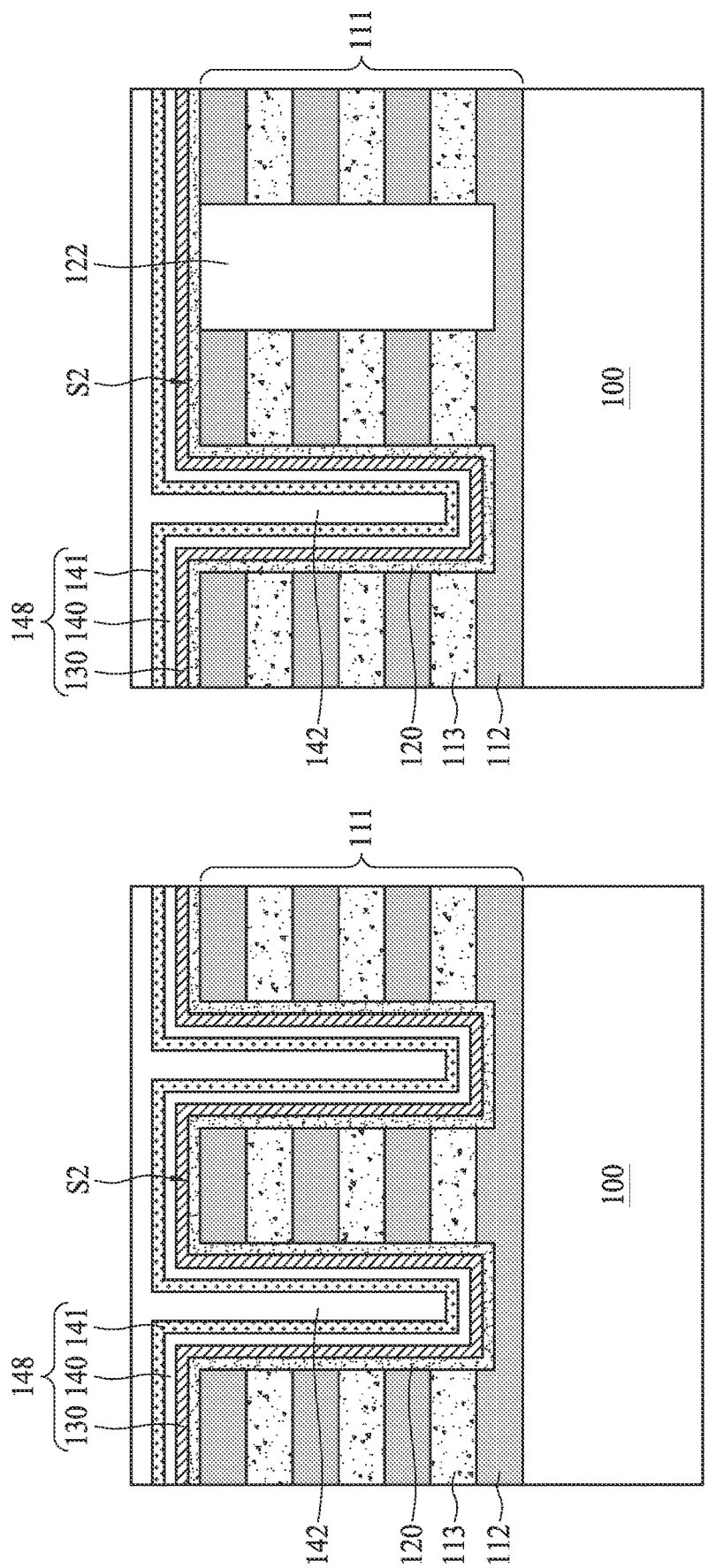
FIGS. 20A and 20B are schematic cross-sectional views illustrating a sequential operation of the method 200 in FIG. 2, in accordance with some embodiments of the present disclosure.

In operation 219, a second dielectric material is deposited on the stacked structure 111, as shown in FIGS. 20A and 20B. The second dielectric material may be formed using a deposition process such as PVD or CVD. In some embodiments, the second dielectric material includes the same material as the first dielectric material for forming the first dielectric member 122. In some embodiments, the second dielectric material completely covers the layered structure 148 and fills a remainder of the trenches T1. The second dielectric material forms a second dielectric member 142 surrounded by the capping layer 141. In some embodiments, multiple second dielectric members 142 are alternately arranged in the stacked structure 111 from the top view.

Figure 21:
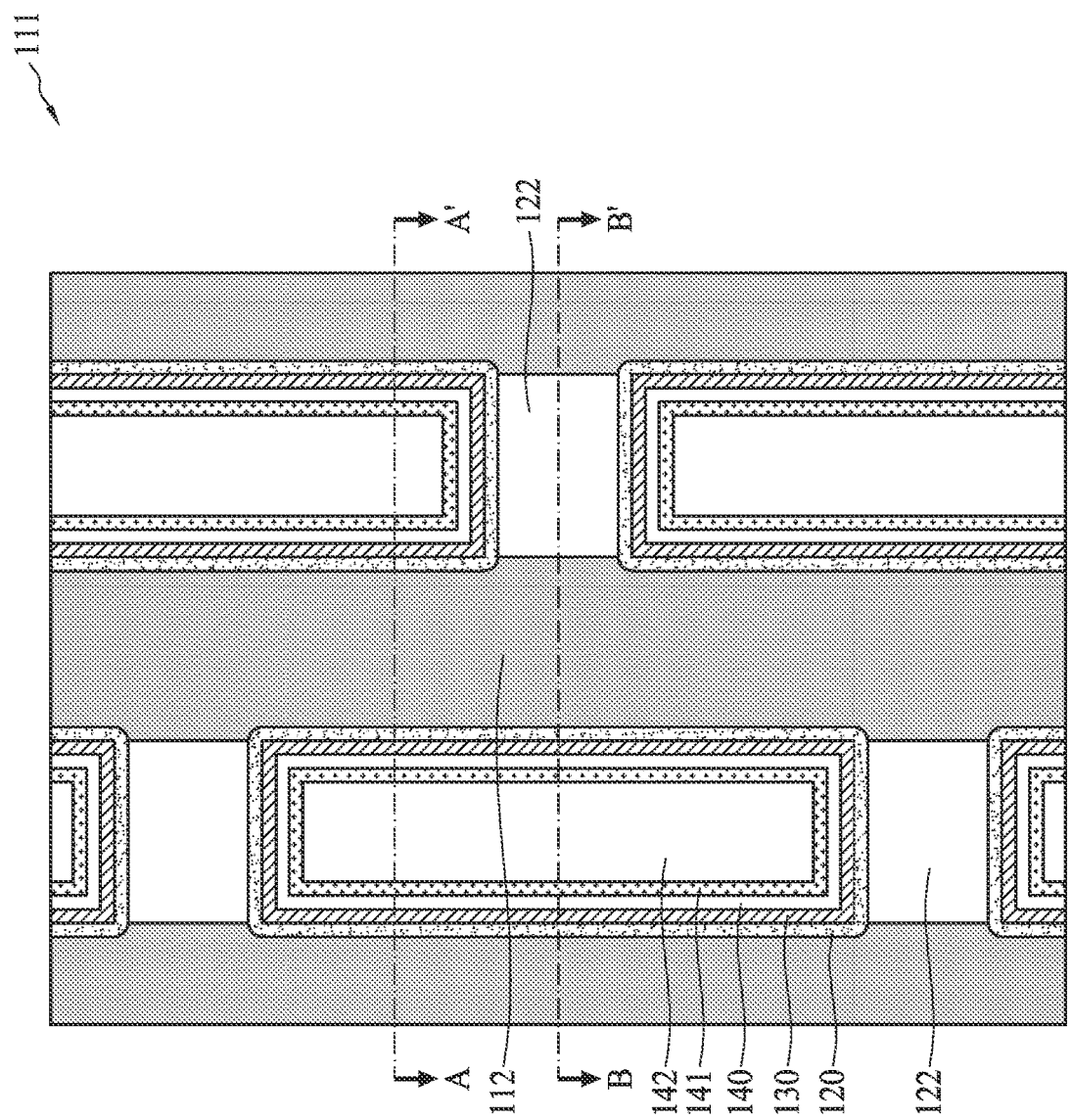
FIG. 21 is a schematic top view illustrating a sequential operation of the method 200 in FIG. 2, in accordance with some embodiments of the present disclosure.

In operation 221, a removal process is performed on the stacked structure 111, as shown in FIG. 21. In some embodiments, the removal process removes portions of the second dielectric member 142, the capping layer 141, the channel layer 140, the memory layer 130 and the liner layer 120 over the stacked structure 111. The removal process may, for example, be performed by a CMP process, an etch-back process, or some other suitable removal process. The etch-back process may, for example, be performed by dry etching or some other suitable type of etching.

FIGS. 22A and 22B are schematic cross-sectional views respectively taken along line A-A' and line B-B' shown in FIG. 21. After the removal process, the top surface S2 of the stacked structure 111 is exposed.

Figure 23:
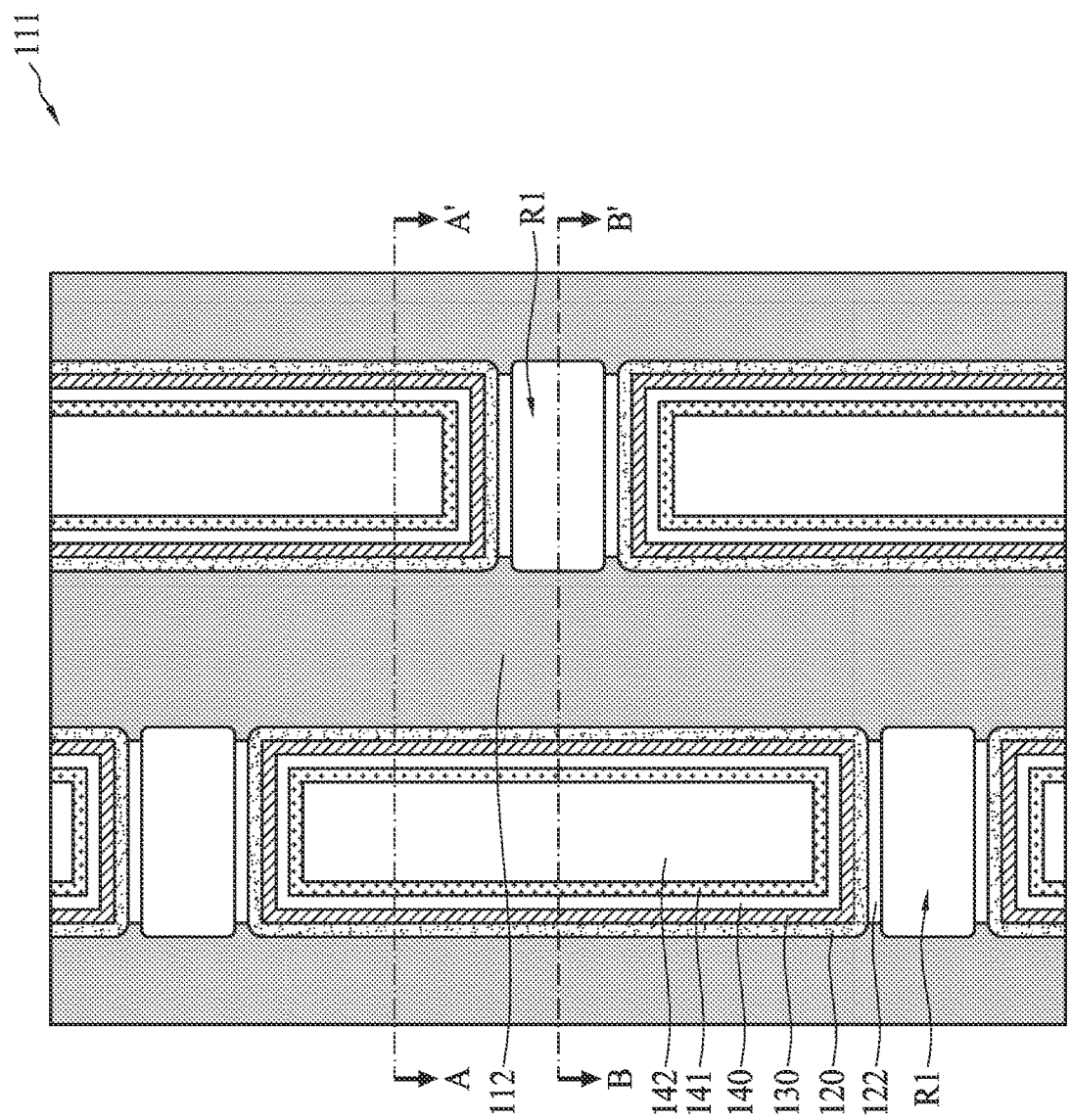
FIG. 23 is a schematic top view illustrating a sequential operation of the method 200 in FIG. 2, in accordance with some embodiments of the present disclosure.

In operation 223, a third etching process is performed on the stacked structure 111, as shown in FIG. 23. In some embodiments, the third etching process is a dry etching process or an RIE process. The third etching process may vertically remove a portion of the first dielectric member 122. After the third etching process, multiple through holes R1 may be formed in the stacked structure 111.

Figure 24A:
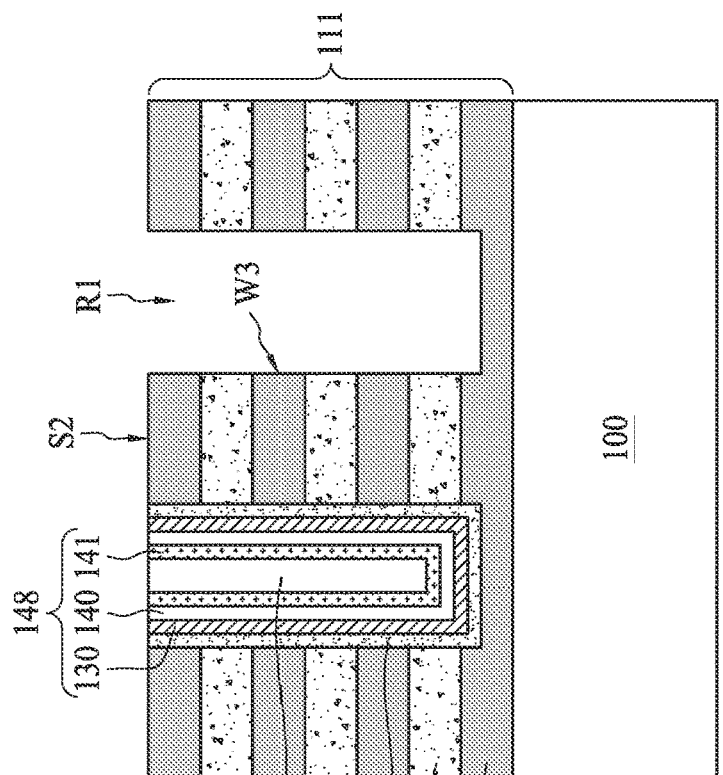
FIGS. 24A and 24B are schematic cross-sectional views respectively taken along line A-A' and line B-B' shown in FIG. 23, in accordance with some embodiments of the present disclosure.
Figure 24B:
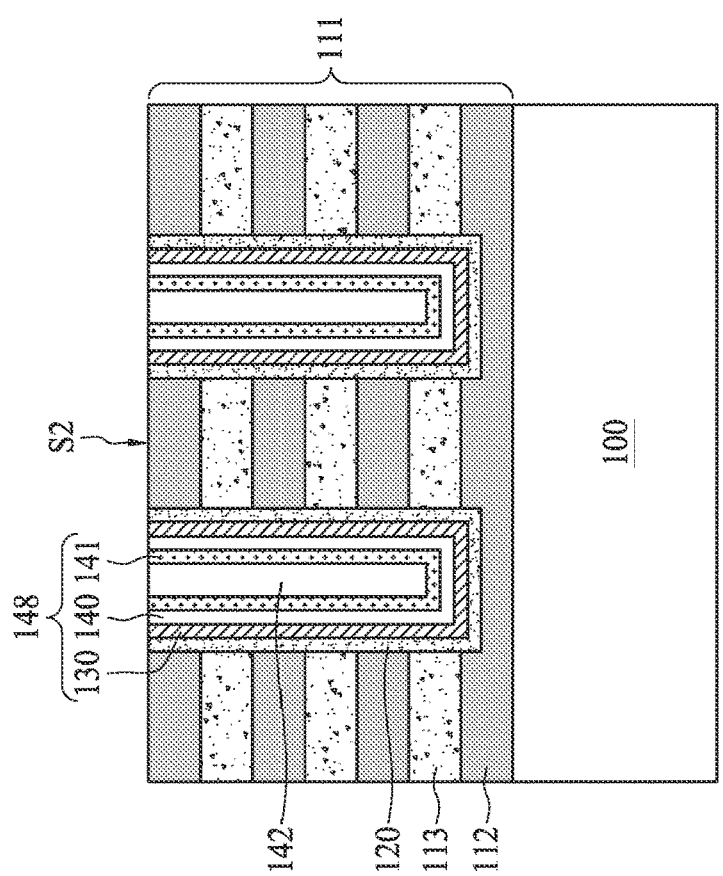

FIGS. 24A and 24B are schematic cross-sectional views respectively taken along line A-A' and line B-B' shown in FIG. 23. FIG. 24A shows a portion of the stacked structure 111 that is protected by a third photoresist (not shown) during the third etching process and thus not etched. FIG. 24B shows another portion of the stacked structure 111 in which the through hole R1 is formed. The through hole R1 may penetrate the top surface S2 and expose an inner sidewall W3 of the stacked structure 111. The profile of the through hole R1 from the top view may be square, rectangular, circular, or some other suitable shape. In some embodiments, the through hole R1 exposes the bottommost insulating layer 112 proximal to the substrate 100.

Figure 25:
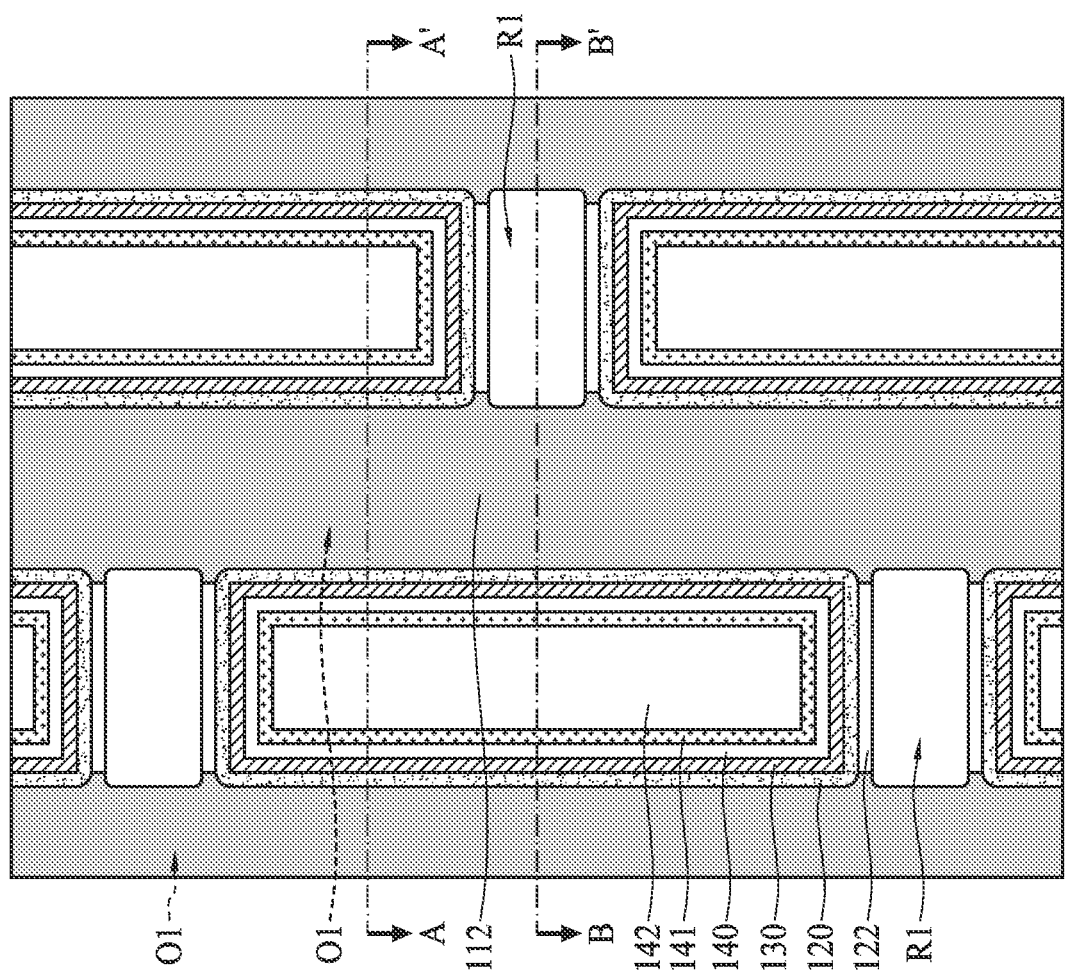
FIG. 25 is a schematic top view illustrating a sequential operation of the method 200 in FIG. 2, in accordance with some embodiments of the present disclosure.

In operation 225, the sacrificial layers 113 are removed, as shown in FIG. 25. In some embodiments, the method of removing the sacrificial layers 113 includes performing a dry etching process or a wet etching process. An etchant used in the dry etching process can be, for example, nitrogen trifluoride ($NF_3$), hydrogen ($H_2$), oxygen ($O_2$), helium (He), or a combination thereof. An etchant used in the wet etching process can be, for example, a hydrobromic acid (HBr) or a phosphoric acid ($H_3PO_4$). In some embodiments, the sacrificial layers 113 are removed by a reaction between the sacrificial layers 113 and a hot phosphoric acid. Referring to FIG. 24B, in some embodiments, the hot phosphoric acid is injected to the stacked structure 111 from the through hole R1. The sacrificial layers 113 exposed by the through hole R1 may laterally react with the hot phosphoric acid and become easily removable.

Figure 26A:
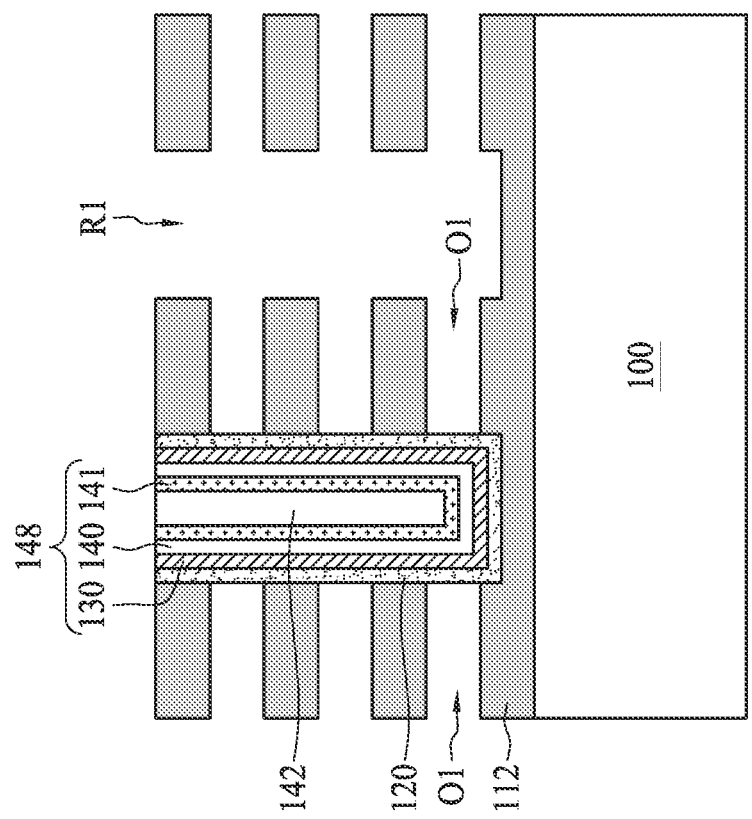
FIGS. 26A and 26B are schematic cross-sectional views respectively taken along line A-A' and line B-B' shown in FIG. 25, in accordance with some embodiments of the present disclosure.
Figure 26B:
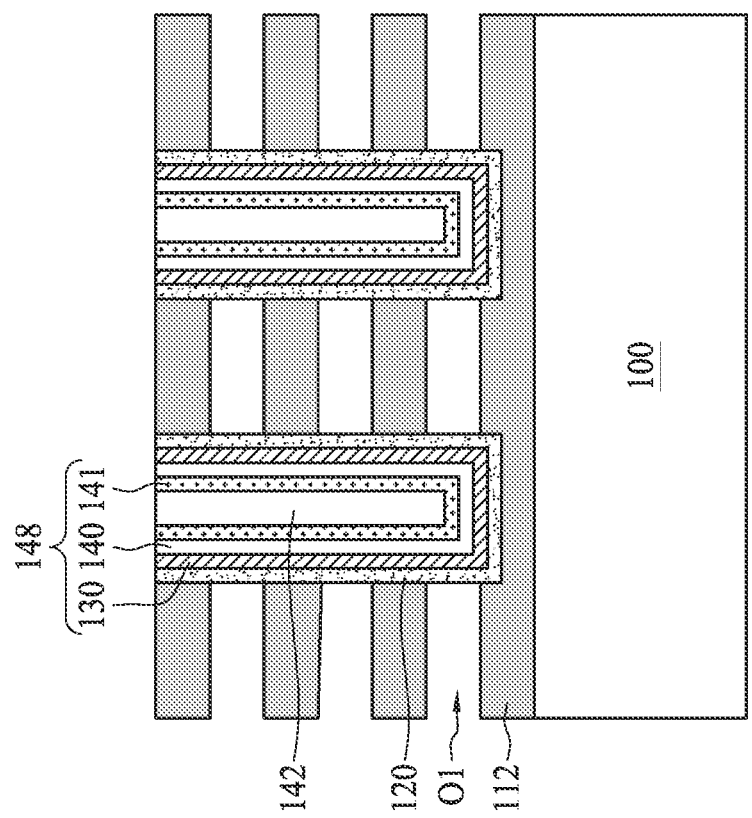

FIGS. 26A and 26B are schematic cross-sectional views respectively taken along line A-A' and line B-B' shown in FIG. 25. In some embodiments, after the sacrificial layers 113 are removed, a lateral opening O1 is formed. The lateral opening O1 may be communicated with the through hole R1 and expose portions of the insulating layers 112 and the liner layer 120. In some embodiments, the sacrificial layer 113 has a sufficient etching selectivity over the liner layer 120, such that the etching stops on the liner layer 120. The sacrificial layer 113 may have an etching rate substantially greater than an etching rate of the liner layer 120 with respect to the hot phosphoric acid. In some embodiments, since the liner layer 120 having a thickness of at least 1 nm surrounds the memory layer 130, it prevents a reaction between the hot phosphoric acid and the memory layer 130. The liner layer 120 may be an etching stop layer (ESL) that protects the memory layer 130 during the removal of the sacrificial layers 113. As a result, the memory layer 130 can remain intact and not damaged when the sacrificial layers 113 are being removed. When the thickness of the liner layer 120 is, for example, less than 1 nm, the liner layer 120 may not be able to resist an etchant used for removing the sacrificial layers 113. As a result, the etchant might penetrate the liner layer 120 and damage the memory layer 130.

Figure 27:
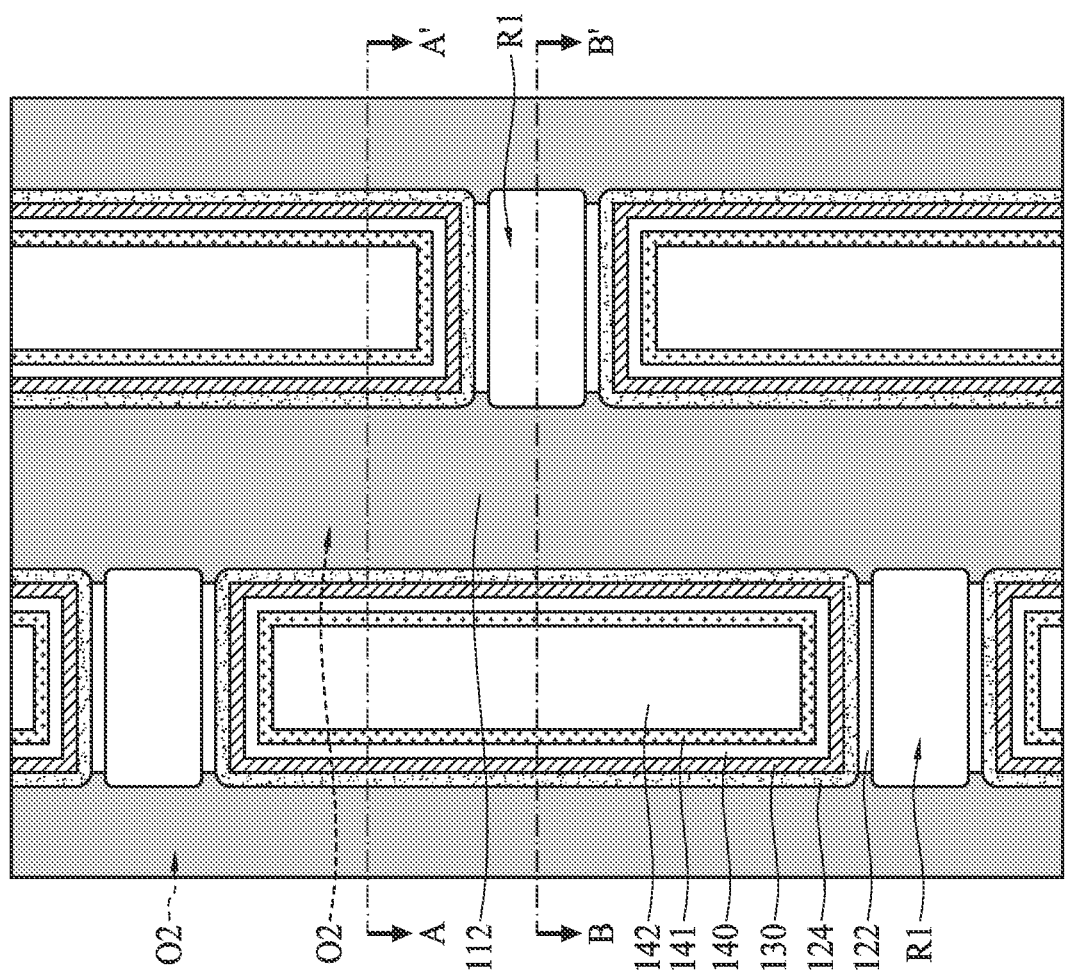
FIG. 27 is a schematic top view illustrating a sequential operation of the method 200 in FIG. 2, in accordance with some embodiments of the present disclosure.

In operation 227, a fourth etching process is performed on the stacked structure 111, as shown in FIG. 27. In some embodiments, the fourth etching process is a wet etching process or an atomic layer etching (ALE) process. The fourth etching process may laterally remove portions of the liner layer 120 exposed by the lateral opening O1. After the fourth etching process, portions of the memory layer 130 are exposed. In some embodiments, the liner layer 120 being etched forms multiple liner members 124 that are separated from each other.

Figure 28A:
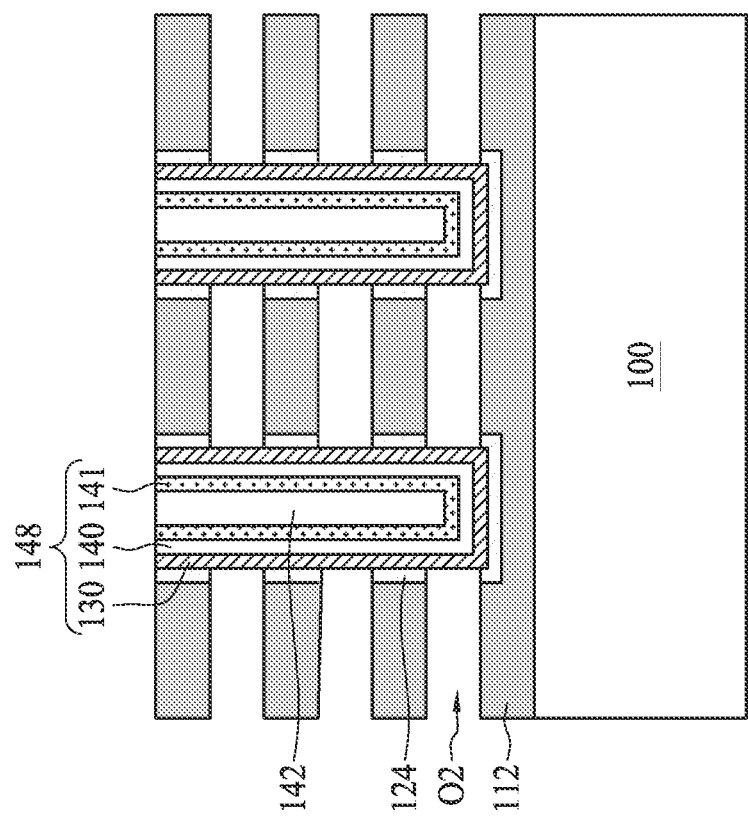
FIGS. 28A and 28B are schematic cross-sectional views respectively taken along line A-A' and line B-B' shown in FIG. 27, in accordance with some embodiments of the present disclosure.
Figure 28B:
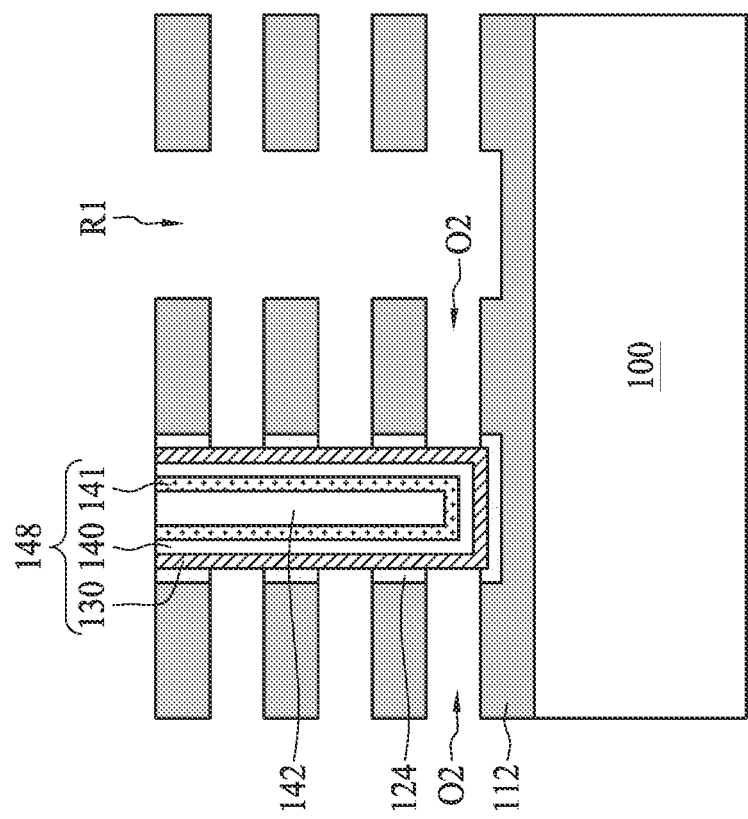

FIGS. 28A and 28B are schematic cross-sectional views respectively taken along line A-A' and line B-B' shown in FIG. 27. In some embodiments, each of the liner members 124 is substantially between the insulating layer 112 and the memory layer 130. Each of the liner members 124 may be a spacer that surrounds a portion of memory layer 130. After the liner layer 120 is partially removed, the lateral opening O1 occupies more space and is referred to as a lateral opening O2. The lateral opening O2 may expose a portion of each of the liner members 124.

Figures 29A, 29B:
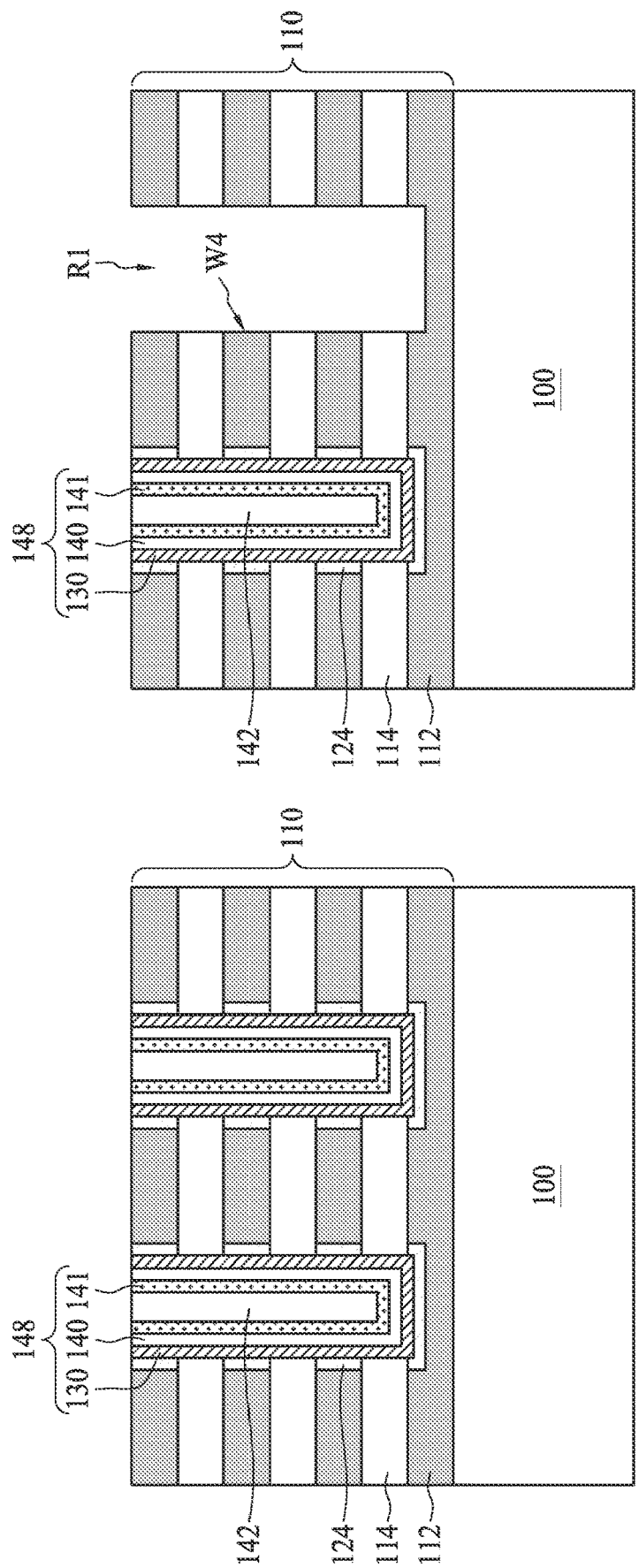
FIGS. 29A and 29B are schematic cross-sectional views illustrating a sequential operation of the method 200 in FIG. 2, in accordance with some embodiments of the present disclosure.

In operation 229, a first conductive material is deposited, as shown in FIGS. 29A and 29B. The first conductive material may be formed using a deposition process such as PVD or CVD. In some embodiments, the first conductive material includes polysilicon, tungsten (W), copper (Cu), cobalt (Co), aluminum (Al), nickel (Ni), tantalum (Ta), titanium (Ti), molybdenum (Mo), palladium (Pd), platinum (Pt), ruthenium (Ru), iridium (Ir) silver (Ag), gold (Au), titanium nitride (TiN), tantalum nitride (TaN), or combinations thereof. In some embodiments, the first conductive material is filled into the lateral opening O2 to form a gate member 114. After the lateral opening O2 is completely filled, excess first conductive material may be pulled back by a dry etching process or a wet etching process. The pullback may, for example, localize the first conductive material to lateral openings O2, and/or remove the first conductive material from atop the stacked structure 110 and/or from through holes R1.

In some embodiments, the sacrificial layers 113 in the stacked structure 111 are replaced with gate members 114 to form a stacked structure 110, which may be referred to as a gate replacement process or a gate-last process. In some embodiments, multiple gate members 114 are alternately arranged with the insulating layers 112 or the liner members 124 in the stacked structure 110. In some embodiments, a gate member 114 is in contact with and electrically coupled to the memory layer 130. In some embodiments, a gate member 114 serves as a word line (WL) in a memory device. In some embodiments, a through hole R1 exposes an inner sidewall W4 of the stacked structure 110. The inner sidewall W4 includes sidewalls of the alternately stacked insulating layers 112 and gate members 114, as shown in FIG. 29B.

Figure 30:
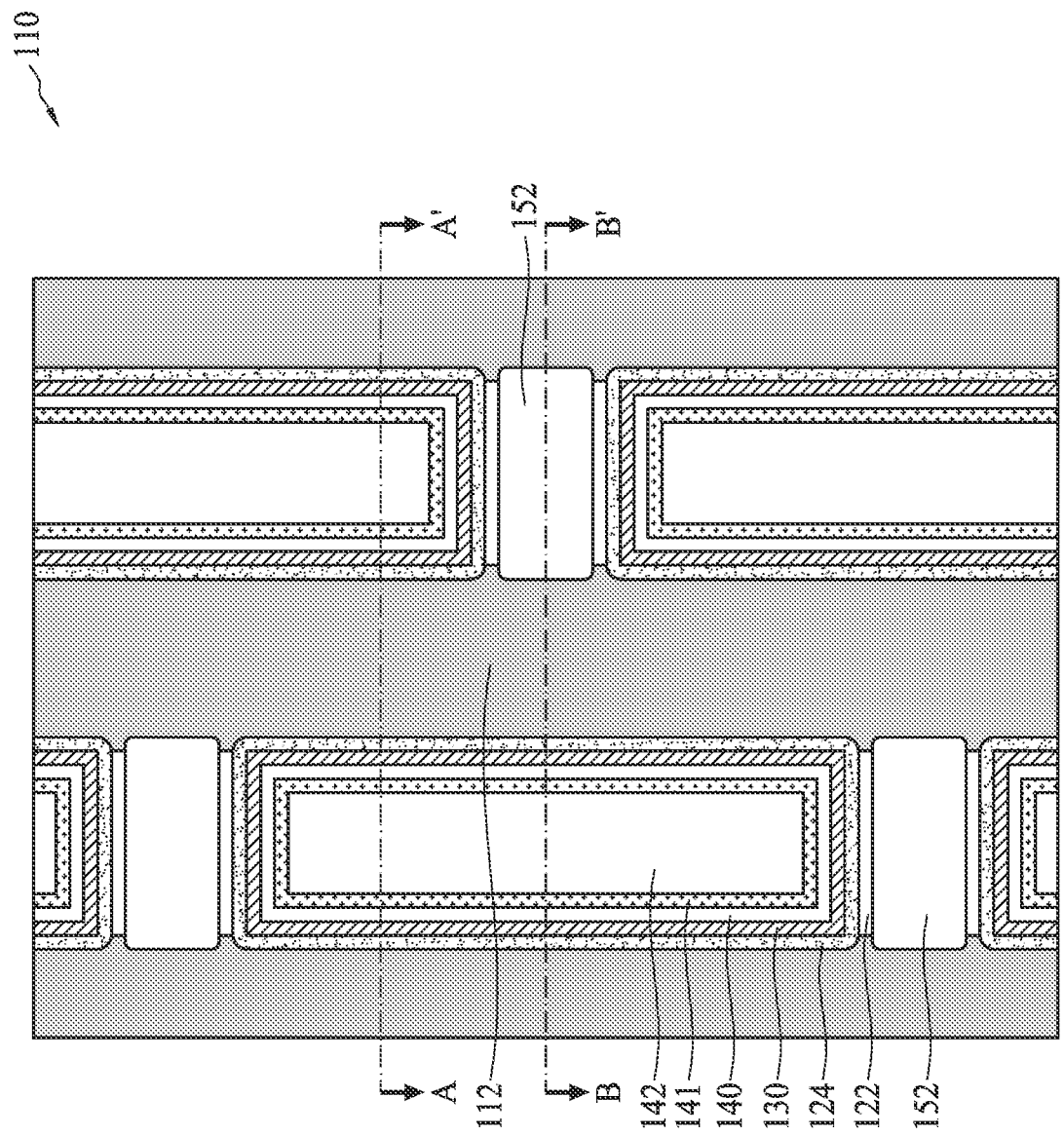
FIG. 30 is a schematic top view illustrating a sequential operation of the method 200 in FIG. 2, in accordance with some embodiments of the present disclosure.

In operation 231, a third dielectric material is deposited on the stacked structure 110, as shown in FIG. 30. The third dielectric material may be formed using a deposition process such as PVD or CVD. In some embodiments, the third dielectric material includes the same material as the first dielectric material or the second dielectric material. In some embodiments, the third dielectric material fills the through hole R1 to form a third dielectric member 152. Multiple third dielectric members 152 may be formed and alternately arranged in the stacked structure 110. In some embodiments, the third dielectric member 152 is adjacent to the first dielectric member 122 from a top view.

Figure 31B:
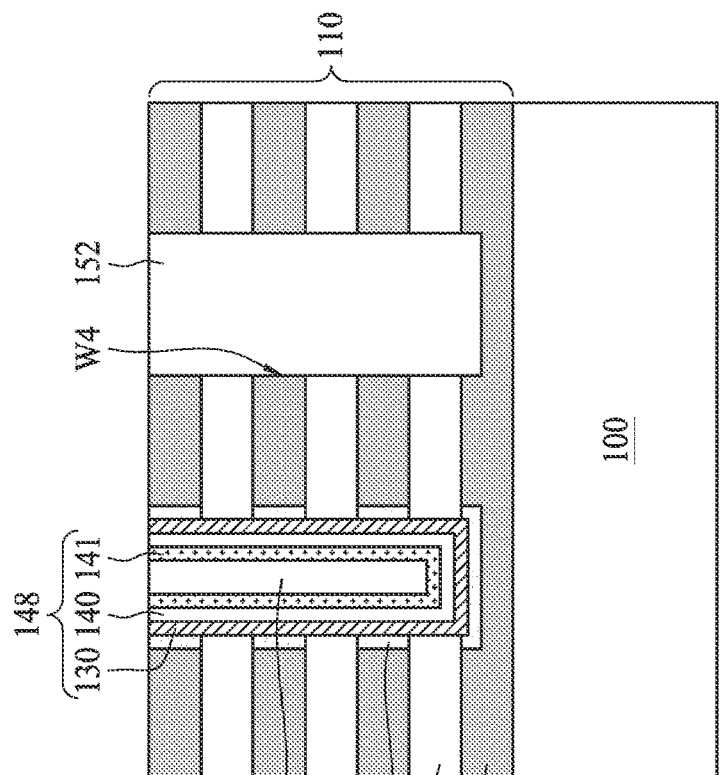
FIGS. 31A and 31B are schematic cross-sectional views respectively taken along line A-A' and line B-B' shown in FIG. 30, in accordance with some embodiments of the present disclosure.
Figure 31A:
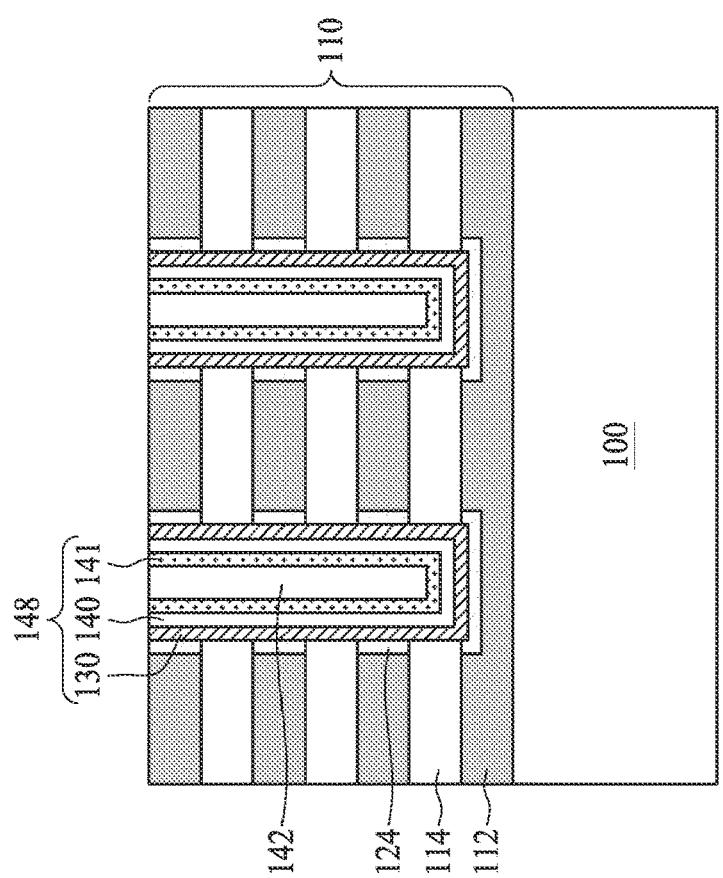

FIGS. 31A and 31B are schematic cross-sectional views respectively taken along line A-A' and line B-B' shown in FIG. 30. The third dielectric member 152 may cover the inner sidewall W4 and the bottommost insulating layer 112 over the substrate 100. After the through hole R1 is completely filled, a CMP process or an etch-back process may be performed to remove excess third dielectric material over the stacked structure 110.

Figure 32:
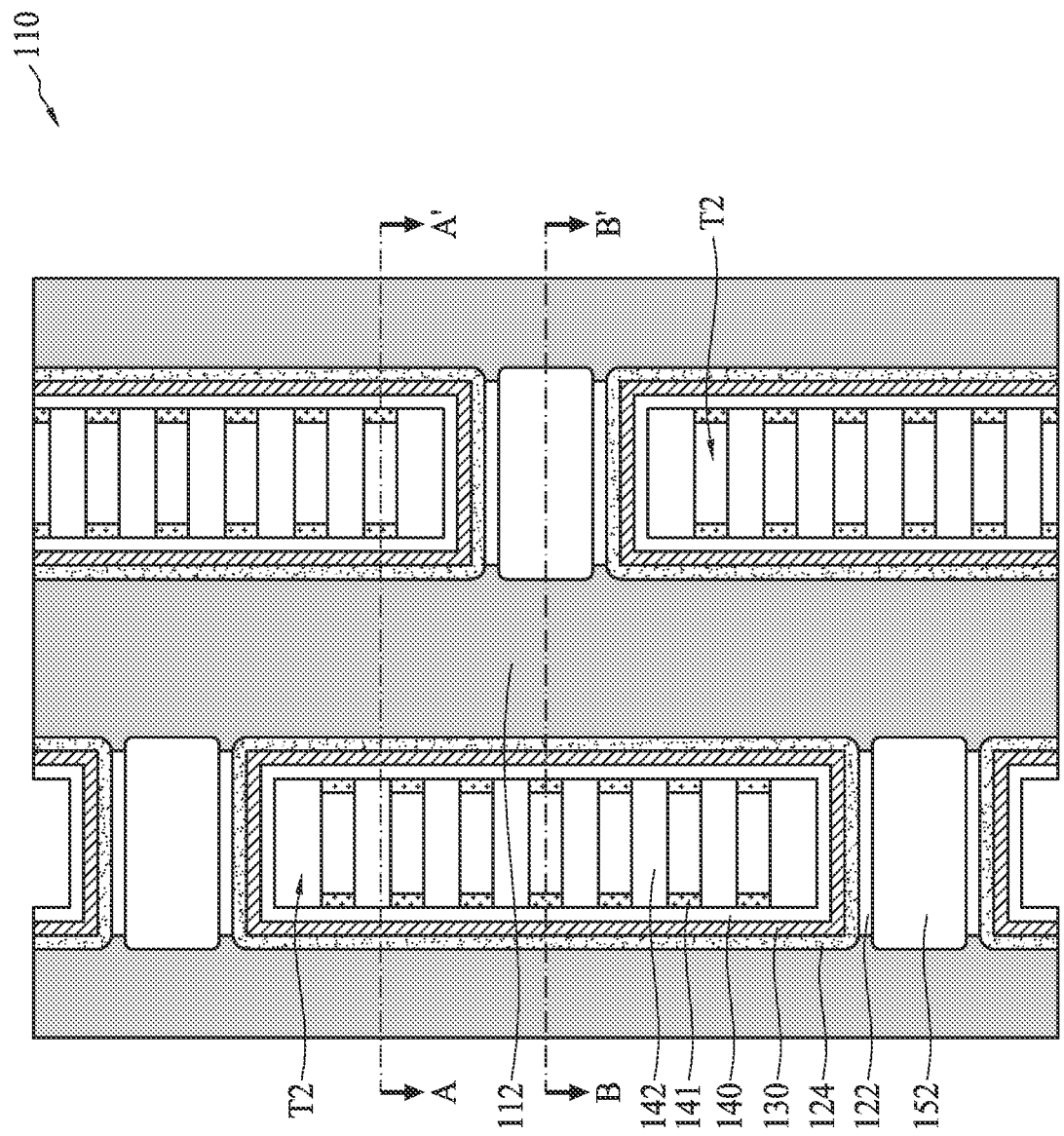
FIG. 32 is a schematic top view illustrating a sequential operation of the method 200 in FIG. 2, in accordance with some embodiments of the present disclosure.

In operation 233, a fifth etching process is performed on the stacked structure 110, as shown in FIG. 32. In some embodiments, the fifth etching process is a dry etching process or an RIE process. The fifth etching process may vertically remove portions of the second dielectric members 142 and the capping layer 141. In some embodiments, multiple capping members 144 are formed after the capping layer 141 is etched. After the fifth etching process, multiple trenches T2 may be formed in the stacked structure 110. In some embodiments, the trenches T2 are separated from each other by the second dielectric members 142 and the capping members 144.

FIGS. 33A and 33B are schematic cross-sectional views respectively taken along line A-A' and line B-B' shown in FIG. 32. In some embodiments, the trench T2 exposes a portion of the channel layer 140. The profile of the trench T2 from the top view may be square, rectangular, circular, or some other suitable shape.

Figure 34:
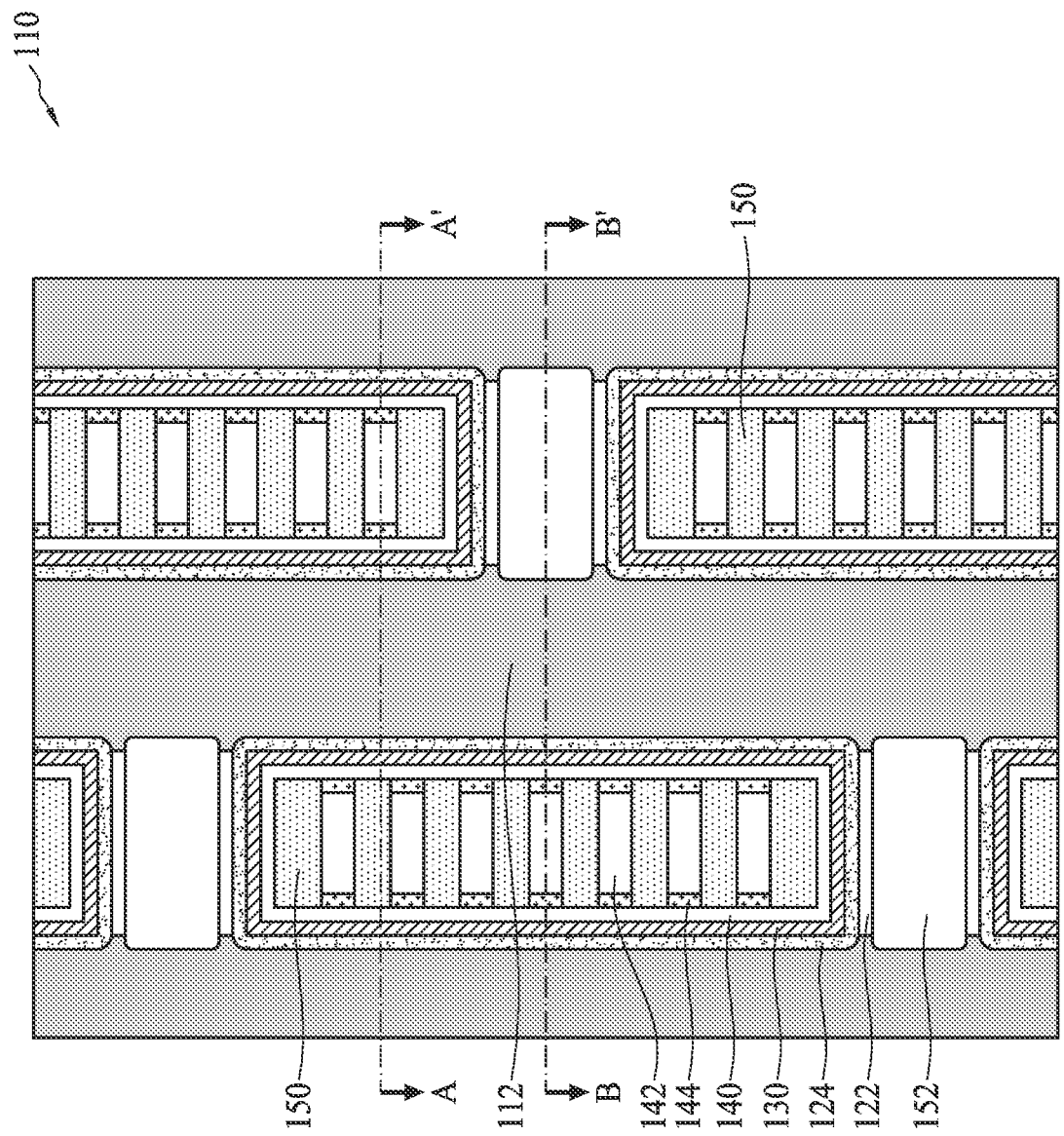
FIG. 34 is a schematic top view illustrating a sequential operation of the method 200 in FIG. 2, in accordance with some embodiments of the present disclosure.

In operation 235, a second conductive material is deposited, as shown in FIG. 34. The second conductive material may be formed using a deposition process such as PVD or CVD. In some embodiments, the second conductive material includes the same material as the first conductive material for forming the gate member 114. In some embodiments, the second conductive material is filled into the trench T2 to form a contact member 150. After the trench T2 is completely filled, excess second conductive material may be pulled back by a CMP process or an etch-back process. In some embodiments, multiple contact members 150 are formed in the channel layer 140. The contact members 150 may be alternately arranged with the second dielectric members 142.

FIGS. 35A and 35B are schematic cross-sectional views respectively taken along line A-A' and line B-B' shown in FIG. 34. In some embodiments, the contact member 150 is surrounded by the channel layer 140 and the memory layer 130. The contact member 150 may have, for example, a pillar-like profile. In some embodiments, the contact member 150 serves as a bit line (BL) or signal line (SL) in a memory device.

Figure 36:
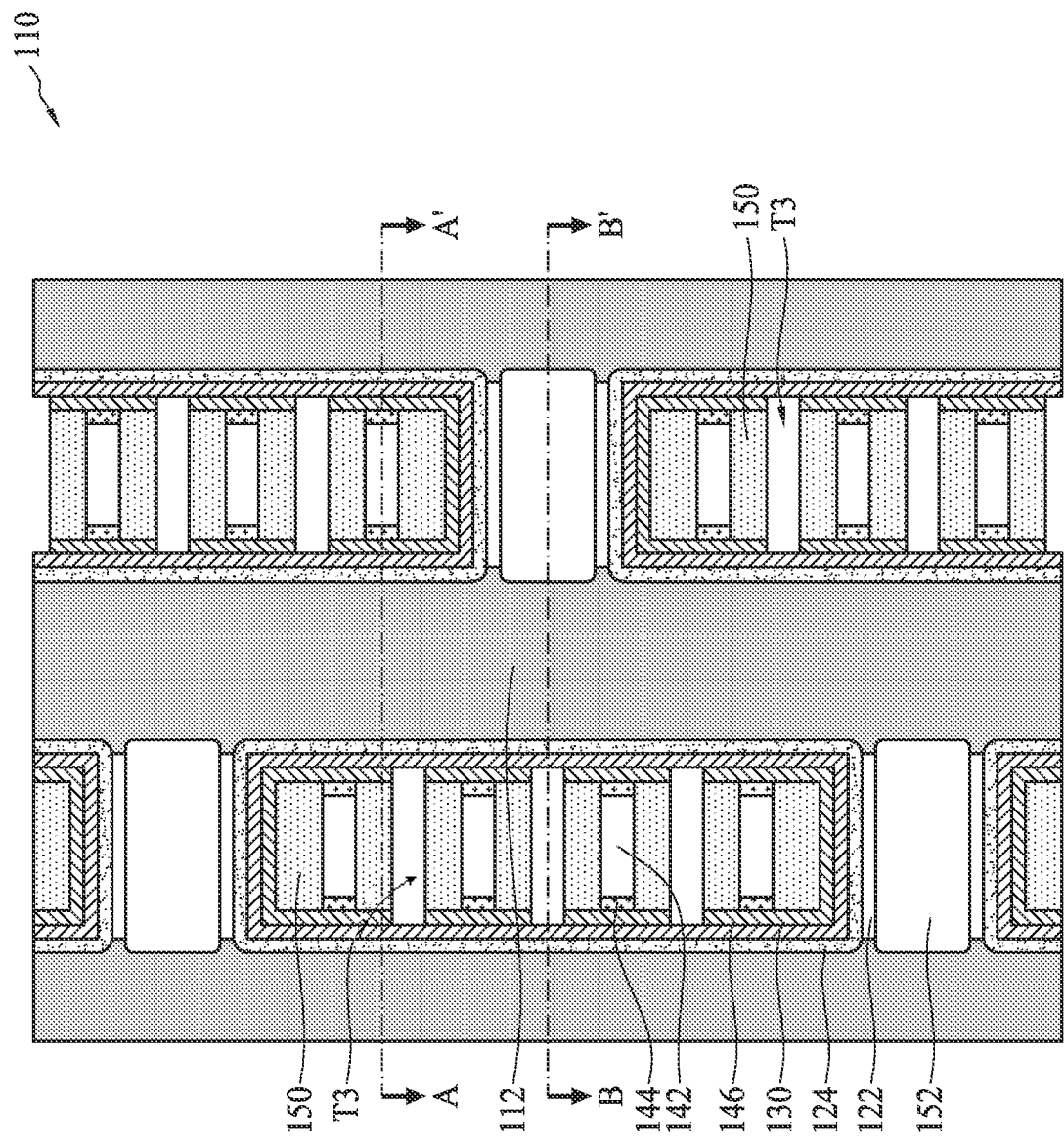
FIG. 36 is a schematic top view illustrating a sequential operation of the method 200 in FIG. 2, in accordance with some embodiments of the present disclosure.

In operation 237, a sixth etching process is performed on the stacked structure 110, as shown in FIG. 36. In some embodiments, the sixth etching process is a dry etching process or an RIE process. The sixth etching process may vertically remove portions of the second dielectric members 142, the capping members 144, and the channel layer 140. In some embodiments, multiple channel members 146 are formed after the channel layer 140 is etched. After the sixth etching process, multiple trenches T3 may be formed in the stacked structure 110. In some embodiments, the trenches T3 are separated from each other by the contact members 150 and the channel members 146.

FIGS. 37A and 37B are schematic cross-sectional views respectively taken along line A-A' and line B-B' shown in FIG. 36. In some embodiments, the trench T3 exposes a portion of the memory layer 130. The profile of the trench T3 from the top view may be square, rectangular, circular, or some other suitable shape. In some embodiments, the memory layer 130, a channel member 146, and a capping member 144 form a layered structure 170 in the stacked structure 110.

Figure 38:
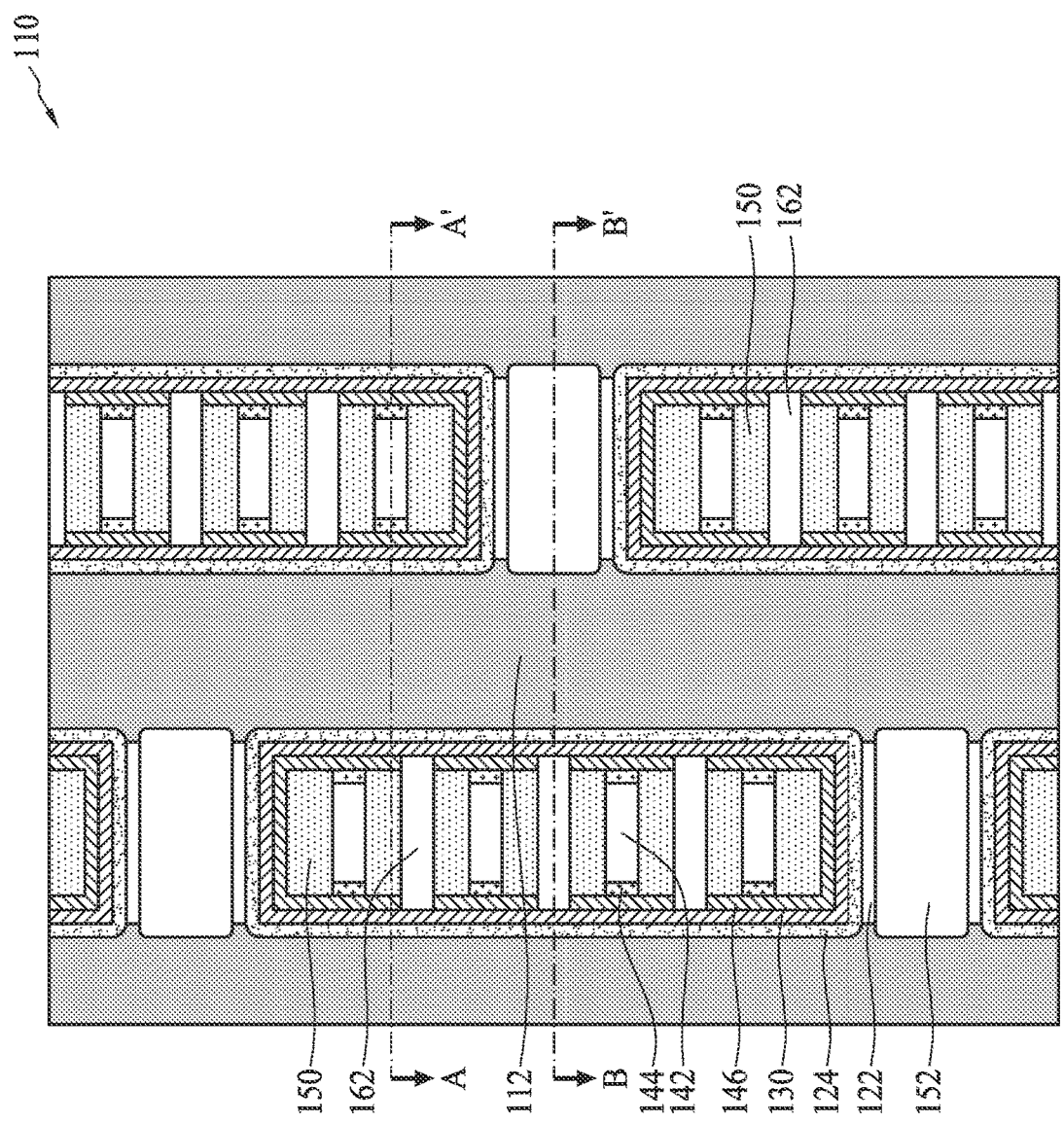
FIG. 38 is a schematic top view illustrating a sequential operation of the method 200 in FIG. 2, in accordance with some embodiments of the present disclosure.

In operation 239, a fourth dielectric material is deposited on the stacked structure 110, as shown in FIG. 38. The fourth dielectric material may be formed using a deposition process such as PVD or CVD. In some embodiments, the fourth dielectric material includes the same material as the first dielectric material, the second dielectric material, or the third dielectric material. In some embodiments, the fourth dielectric material fills a trench T3 to form a fourth dielectric member 162. Multiple fourth dielectric members 162 may be formed in the stacked structure 110. In some embodiments, the fourth dielectric members 162 are alternately arranged with the channel members 146 in the memory layer 130. Each of channel members 146 may form a cell isolated by the fourth dielectric member 162.

FIGS. 39A and 39B are schematic cross-sectional views respectively taken along line A-A' and line B-B' shown in FIG. 38. In some embodiments, the fourth dielectric member 162 is surrounded by the memory layer 130. After the trench T3 is completely filled, a CMP process or an etch-back process may be performed to remove excess fourth dielectric material over the stacked structure 110.

Figure 40:
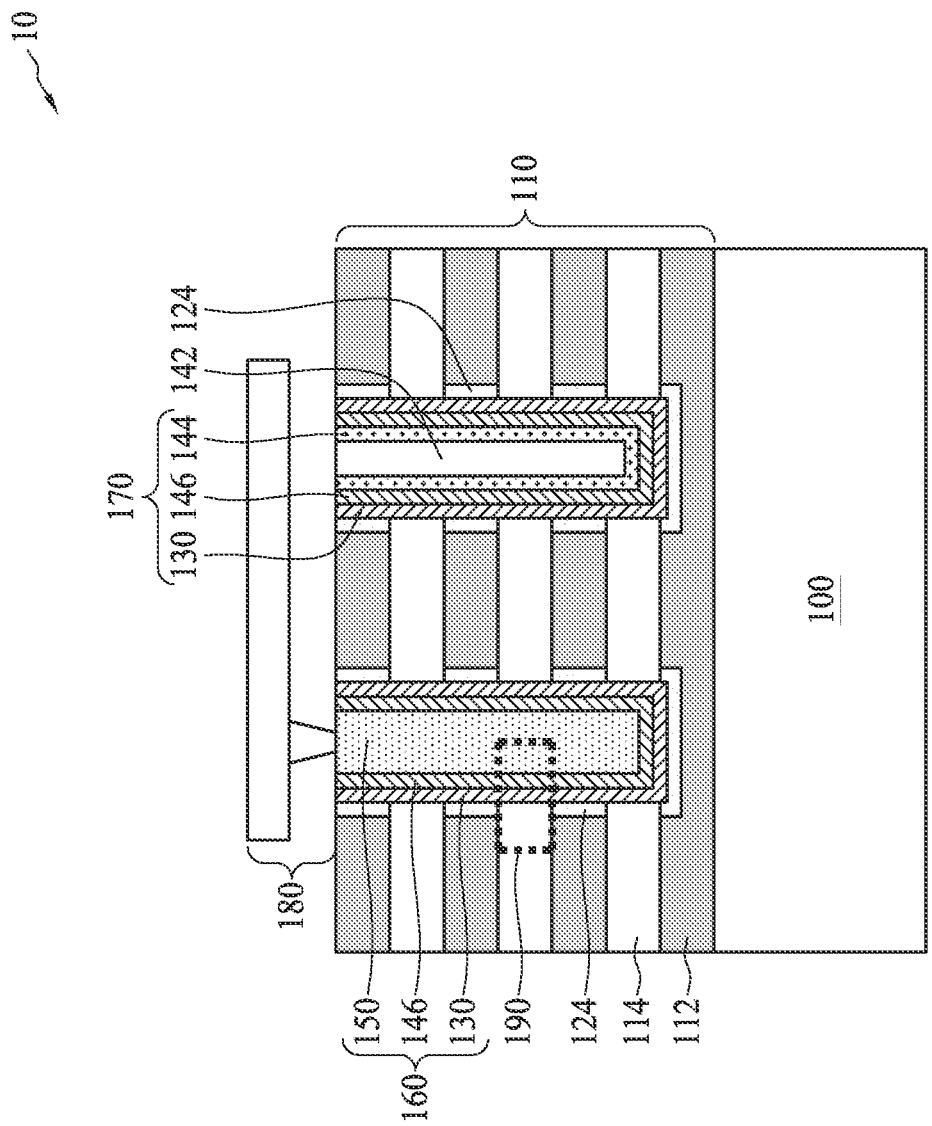
FIG. 40 is a schematic cross-sectional view illustrating a sequential operation of the method 200 in FIG. 2, in accordance with some embodiments of the present disclosure.

In operation 241, a routing process is performed on the stacked structure 110, as shown in FIG. 40. In some embodiments, the routing process is used to form an interconnect structure 180 on the stacked structure 110. The interconnect structure 180 may include a vertical metallic member and a horizontal metallic member on the vertical metallic member. In some embodiments, the vertical metallic member is formed on and electrically coupled to the contact member 150. The vertical metallic member and the horizontal metallic member may be formed using a PVD process or an electroplating process. In some embodiments, the vertical metallic member and the horizontal metallic member are made of copper (Cu), tungsten (W), aluminum (Al), or other suitable materials. As a result, the semiconductor structure 10 is formed.

In some embodiments, the semiconductor structure 10 is a ferroelectric memory device. The ferroelectric memory device may include a core structure 160 and the layered structure 170. In some embodiments, the core structure 160 is composed of the memory layer 130, a channel member 146, and a contact member 150. The core structure 160 may have, for example, a pillar-like profile. In some embodiments, multiple core structures 160 are arranged in the stacked structure 110. Each of the liner members 124 at a core structure 160 may surround a portion of the core structure 160 and protect the memory layer 130 in the core structure 160. In some embodiments, multiple layered structures 170 are arranged in the stacked structure 110. Each of the liner members 124 at a layered structure 170 may surround a portion of the layered structure 170 and protect the memory layer 130 in the layered structure 170.

In some embodiments, multiple memory cells 190 are disposed at interfaces between the stacked structure 110 and the core structure 160. Each of the memory cells 190 includes a gate member 114, a portion of the memory layer 130 confronted with the gate member 114, a portion of the channel member 146 corresponding to the portion of the memory layer 130, and a portion of the contact member 150 corresponding to the portion of the channel member 146. In some embodiments, the core structure function as a source line (SL) or a bit line (BL).

The present disclosure is directed to a semiconductor structure employed in a ferroelectric memory device and a method for fabricating the semiconductor structure. Ferroelectric materials are sensitive to some chemicals and may be damaged thereby when producing the ferroelectric memory device. In this disclosure, a gate replacement process is used. During the gate replacement process, a sacrificial layer of a stacked structure is removed and will subsequently be replaced with a gate layer. However, a ferroelectric material of a memory layer in the stacked structure may be consumed by an etchant used to remove the sacrificial layer. Therefore, a liner layer is formed on the memory layer to prevent a loss of the ferroelectric material in the gate replacement process. The liner layer functions as an etching stopping layer that completely isolates the memory layer and the etchant. As a result, the ferroelectric material of the memory layer can remain intact and a higher yield of the ferroelectric memory device can be obtained.

One aspect of the present disclosure provides a method of forming a semiconductor structure. The method includes providing a substrate comprising a stacked structure disposed thereon, wherein the stacked structure includes multiple alternately stacked insulating layers and sacrificial layers; removing portions of the stacked structure to form multiple first trenches to expose one of the insulating layers proximal to the substrate; conformally forming a liner layer in the first trenches; conformally forming a memory layer over the liner layer; conformally forming a channel layer over the memory layer; conformally forming a capping layer over the channel layer; depositing a dielectric layer over the capping layer to fill the first trenches; removing the sacrificial layers to form multiple openings in the stacked structure; removing portions of the liner layer exposed by the openings; and depositing a first conductive material to fill the openings.

In some embodiments, an etching rate of the insulating layers is substantially different from an etching rate of the sacrificial layers.

In some embodiments, the method further includes forming a through hole between two of the adjacent first trenches before the removal of the sacrificial layers.

In some embodiments, the through hole exposes sidewalls of the alternately stacked insulating layers and sacrificial layers.

In some embodiments, the removal of the sacrificial layers includes using an etchant injected from the through hole to react with the sacrificial layers.

In some embodiments, the through hole is communicated with the openings after the sacrificial layers are removed.

In some embodiments, the liner layer separates the etchant and the memory layer during the removal of the sacrificial layers.

In some embodiments, the etching rate of the sacrificial layers is substantially greater than an etching rate of the liner layer with respect to the etchant.

In some embodiments, the method further includes removing the dielectric layer and the capping layer to form a second trench; depositing a second conductive material into the second trench to form a bit line or a signal line; and forming an interconnect structure on the second conductive material.

One aspect of the present disclosure provides another method of forming a semiconductor structure. The method includes providing a substrate; forming a stacked structure including an insulating layer and a sacrificial layer over the insulating layer on the substrate; forming an isolation structure in the stacked structure; recessing a portion of the stacked structure adjacent to the isolation structure to form a trench; forming a liner layer in the trench; forming a memory layer over the liner layer; forming a channel layer over the memory layer; forming a capping layer over the channel layer; depositing a first dielectric layer over the capping layer; and replacing the sacrificial layer with a gate layer.

In some embodiments, the replacement of the sacrificial layer with the gate layer includes: etching the isolation structure to form a through hole that exposes sidewalls of the insulating layer and the sacrificial layer; using an etchant to react with the sacrificial layer; removing the sacrificial layer to form an opening in the stacked structure; removing a portion of the liner layer exposed by the opening; filling the opening with the gate layer; and filling the through hole with a second dielectric layer.

In some embodiments, the liner layer isolates the memory layer and the etchant during the replacement of the sacrificial layer with the gate layer.

Another aspect of the present disclosure provides a semiconductor structure. The semiconductor structure includes a substrate, a stacked structure, a core structure and a liner member. The stacked structure is disposed on the substrate and includes multiple alternately stacked insulating layers and gate members. The core structure is disposed in the stacked structure and includes a memory layer, a channel member disposed on the memory layer, and a contact member disposed on the channel member. The liner member surrounds a portion of the core structure.

In some embodiments, the semiconductor structure further includes an interconnect structure disposed on the contact member.

In some embodiments, the liner member includes undoped silicon, silicon carbide (SiC), silicon oxynitride (SiON), titanium oxide ($TiO_2$), hafnium oxide ($HfO_2$) or zirconium oxide ($ZrO_2$).

In some embodiments, a thickness of the liner member is substantially less than 50 nanometers (nm).

In some embodiments, the channel member is surrounded by the memory layer and the contact member is surrounded by the channel member.

In some embodiments, a portion of the insulating layers is surrounded by the liner member.

In some embodiments, the liner member is interposed between the gate members.

In some embodiments, the liner member is in contact with the memory layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a stacked structure on the substrate and comprising multiple alternately stacked insulator layers and gate members, wherein the gate members comprise a first gate member, and wherein the insulator layers comprise a first insulator layer underlying the first gate member and a second insulator layer overlying the first gate member;
   a core structure in the stacked structure and comprising:
      a memory layer;
      a channel member on the memory layer; and
      a contact member on the channel member; and
   a liner member surrounding a portion of the core structure and overlying the first gate member,
   wherein conductive material of the first gate member extends continuously from the first insulator layer to the second insulator layer and to the liner member.

2. The semiconductor structure according to claim 1, wherein the first gate member and the liner member have individual sidewalls facing the core structure and arranged edge to edge to form a common sidewall.

3. The semiconductor structure according to claim 1, wherein the gate members comprise a second gate member overlying the first gate member, and wherein the liner member is directly under the second gate member.

4. The semiconductor structure according to claim 3, wherein the liner member extends continuously from a bottom surface of the second gate member to a top surface of the first gate member.

5. The semiconductor structure according to claim 1, wherein the channel member is surrounded by the memory layer and the contact member is surrounded by the channel member.

6. The semiconductor structure according to claim 1, wherein the channel member has a continuous, U-shaped profile extending to a top of the stacked structure.

7. The semiconductor structure according to claim 1, wherein the conductive material of the first gate member contacts a sidewall of the memory layer.

8. A semiconductor structure, comprising:
   a substrate;
   a stacked structure on the substrate and comprising multiple insulator layers and multiple gate members that are alternatingly stacked, wherein the multiple insulator layers comprise a first insulator layer;
   a core structure in the stacked structure and comprising:
      a memory layer;
      a contact member; and
      a channel member between the memory layer and the contact member; and
   a liner member surrounding a portion of the core structure,
   wherein the liner member is laterally and directly between the first insulator layer and the memory layer and further has a same height as the first insulator layer, wherein the core structure comprises a plurality of contact members, including the contact member, and wherein the liner member extends continuously in a closed path around the plurality of contact members when viewed top down.

9. The semiconductor structure according to claim 8, wherein the liner member has a ring-shaped top geometry.

10. The semiconductor structure according to claim 8, wherein the first insulator layer is at a top of the stacked structure.

11. The semiconductor structure according to claim 8, wherein the multiple gate members comprise a first gate member and a second gate member, and wherein the same height corresponds to a separation between the first gate member and the second gate member.

12. The semiconductor structure according to claim 8, wherein the liner member includes undoped silicon, silicon carbide (SiC), silicon oxynitride (SiON), titanium oxide ($TiO_2$), hafnium oxide ($HfO_2$), or zirconium oxide ($ZrO_2$).

13. The semiconductor structure according to claim 8, wherein the contact member has a bottom surface directly contacting a top surface of the channel member.

14. The semiconductor structure according to claim 8, wherein the plurality of contact members have individual top surfaces elevated relative to a topmost gate member of the multiple gate members and individual bottom surfaces recessed relative to a bottommost gate member of the multiple gate members.

15. A semiconductor structure, comprising:
   a substrate;
   a stacked structure on the substrate and comprising multiple insulator layers and multiple gate members that are alternatingly stacked;
   a core structure in the stacked structure and comprising:
      a memory layer having a sidewall facing the stacked structure;
      a contact member; and
      a channel member between the memory layer and the contact member; and
   a plurality of liner members between the stacked structure and the sidewall of the memory layer,
   wherein the plurality of liner members are spaced from each other along the sidewall of the memory layer, from a bottom of the stacked structure to a top of the stacked structure, wherein a first gate member of the multiple gate members has a conductive sidewall that underlies and is edge to edge with a dielectric sidewall of a first liner member of the plurality of liner members to form a common sidewall facing the sidewall of the memory layer.

16. The semiconductor structure according to claim 15, wherein the plurality of liner members are alternatingly stacked with the multiple gate members, from the bottom of the stacked structure to the top of the stacked structure.

17. The semiconductor structure according to claim 15, wherein the core structure comprises a plurality of contact members, including the contact member, and wherein the memory layer and the plurality of liner members extend continuously in individual closed paths around the plurality of contact members when viewed top down.

18. The semiconductor structure according to claim 17, wherein the core structure comprises a plurality of channel members, including the channel member, wherein the plurality of channel members are spaced from each other and are arranged in a ring-shaped path around the plurality of contact members when viewed top down, and wherein the individual closed paths of the memory layer and the plurality of liner members surround the plurality of channel members.

19. The semiconductor structure according to claim 15, wherein the memory layer has a continuous, U-shaped profile extending to the top of the stacked structure.

20. The semiconductor structure according to claim 15, wherein the common sidewall contacts the sidewall of the memory layer.

* * * * *